United States Patent
Lee et al.

(10) Patent No.: US 7,307,305 B2
(45) Date of Patent: Dec. 11, 2007

(54) SEMICONDUCTOR DEVICE

(75) Inventors: Jae-Goo Lee, Kyungki-do (KR); Cheol-Ju Yun, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 81 days.

(21) Appl. No.: 11/143,197

(22) Filed: Jun. 1, 2005

(65) Prior Publication Data
US 2005/0218439 A1    Oct. 6, 2005

Related U.S. Application Data

(62) Division of application No. 10/697,722, filed on Oct. 29, 2003, now Pat. No. 6,916,738.

(30) Foreign Application Priority Data
Feb. 24, 2003   (KR) ............................... 2003-11310

(51) Int. Cl.
*H01L 27/108* (2006.01)
(52) U.S. Cl. .................................... 257/296
(58) Field of Classification Search ............ None
See application file for complete search history.

(56) References Cited

U.S. PATENT DOCUMENTS

| | | |
|---|---|---|
| 5,500,080 A | 3/1996 | Choi |
| 5,879,986 A | 3/1999 | Sung |
| 6,093,641 A | 7/2000 | Park |
| 6,214,715 B1 | 4/2001 | Huang et al. |
| 6,458,692 B1 * | 10/2002 | Kim ........................... 438/639 |
| 2002/0090792 A1 * | 7/2002 | Wu et al. ................... 438/396 |
| 2004/0188806 A1 | 9/2004 | Chung et al. |

FOREIGN PATENT DOCUMENTS

JP          2001-217405          8/2001

OTHER PUBLICATIONS

English Language Abstract of Japanese Patent Publication No. 2001-217405.

* cited by examiner

*Primary Examiner*—Kiesha Rose
(74) *Attorney, Agent, or Firm*—Marger Johnson & McCollom, P.C.

(57) ABSTRACT

Bit lines having first conductive patterns and bit line mask patterns are formed on a first insulating layer between capacitor contact regions of a substrate. An oxide second insulating layer is formed on the bit lines and contact patterns are formed to open storage node contact hole regions corresponding to portions of the second insulating layer. First spacers are formed on sidewalls of the etched portions. The second and first insulating layers are etched to form storage node contact holes exposing the capacitor contact regions. Simultaneously, second spacers of the second insulating layer are formed beneath the first spacers. A second conductive layer fills the storage node contact holes to form storage node contact pads. A loss of the bit line mask pattern decreases due to the reduced thickness of the bit line mask pattern and a bit line loading capacitance decreases due to the second spacers.

19 Claims, 31 Drawing Sheets

SEMICONDUCTOR DEVICE

CROSS REFERENCE TO RELATED APPLICATIONS

This application is a Divisional of U.S. Ser. No. 10/697,722, filed on Oct. 29, 2003 now U.S. Pat. No. 6,916,738, which claims priority from Korean Patent Application No. 2003-11310, filed on Feb. 24, 2003, which are hereby incorporated by reference in their entirety.

BACKGROUND OF THE INVENTION

1. Field of the Invention

This disclosure relates to a semiconductor device and, more particularly, to a dynamic random access memory (DRAM) and a method of manufacturing the same.

2. Description of the Related Art

As technologies for manufacturing semiconductor devices have been developed and applications for memory devices have been expanded, memory devices having large capacities have been required. In particular, an integration density of a DRAM device wherein a memory cell is composed of one capacitor and one transistor has been remarkably improved.

Accordingly, as an integration density of a semiconductor device increases, a size of the contact hole connecting one element to another element or one layer to another layer decreases but a thickness of interlayer dielectric layer increases. Thus, in a photolithographic process, an aspect ratio of the contact hole, i.e., a ratio of a length of a hole relative to its diameter, is increased while an alignment margin of the contact hole decreases. As a result, formation of a small contact hole becomes very difficult using conventional methods.

As for a DRAM device, a method for forming a landing pad is widely used to reduce the aspect ratio of the contact hole and a self-aligned contact (SAC) structure is employed to a pattern having a feature size of about 0.1 um or less to correct a short-circuit problem caused by a reduction of the alignment margin.

FIGS. 1A, 2A, 1B, and 2B are cross-sectional diagrams illustrating a method of manufacturing a DRAM device having an SAC structure according to a conventional method. FIGS. 1A and 2A are cross-sectional diagrams along a bit line direction of the DRAM device and FIGS. 1B and 2B are cross-sectional diagrams along a word line direction of the DRAM device.

Referring to FIGS. 1A and 1B, isolation regions 12 are formed on a semiconductor substrate 10 to define active regions using a common isolation process such as a shallow trench isolation (STI) process.

Metal oxide semiconductor (MOS) transistors having gate electrodes 14 serving as the word lines and source/drain regions (not shown) are formed on the substrate 10. Gate capping layer patterns 16 composed of nitride are formed on the gate electrode 14 and gate spacers 18 composed of nitride are formed on sidewalls of the gate electrode 14.

A first interlayer dielectric layer 20 composed of oxide is formed on an entire surface of the substrate 10 including the MOS transistors. The first interlayer dielectric layer 20 is planarized by a chemical mechanical polishing (CMP) process or an etch-back process. Using an etching gas having an etching selectivity relative to nitride, the first interlayer dielectric layer 20 is etched to from contact holes that are self-aligned relative to the gate electrodes 14. The contact holes expose the source/drain regions of the MOS transistors.

A doped polysilicon layer is formed on the first interlayer dielectric layer 20 and the contact holes. The doped polysilicon layer is separated into node units by a CMP process or an etch-back process so that SAC pads 22a and 22b are formed in the contact holes. The SAC pads 22a and 22b are connected to the source/drain regions, respectively.

A second interlayer dielectric layer 24 composed of oxide is formed on the first interlayer dielectric layer 20 and on the SAC pads 22a and 22b. The second interlayer dielectric layer has a thickness of about 1,000~3,000 Å. The second interlayer dielectric layer 24 is planarized by a CMP process or an etch-back process. With a common photolithographic process, the second interlayer dielectric layer 24 is partially etched to form bit line contact holes (not shown) exposing some SAC pads 22b positioned on the drain regions.

A barrier metal layer (not shown) composed of titanium/titanium nitride (Ti/TiN) and a first conductive layer 26 for bit lines 30 are sequentially formed on the second interlayer dielectric layer 24 and the bit line contact holes. The first conductive layer 26 is formed to have a thickness of about 400~800 Å. A nitride film is formed on the first conductive layer 26 to have a thickness of about 1,000~3,000 Å so that a bit line mask layer 28 is formed. The bit line mask layer 28 and the first conductive layer 26 are etched by a photolithographic process, thereby forming the bit lines 30 including the first conductive layer 26 and the bit line mask layer 28. At this time, to enlarge an insulation space (i.e., shoulder) between the bit line 30 and a storage node contact hole during a subsequent process of forming the storage node contact holes, the bit line mask layer 28 should be thickly formed to have a thickness of about 200 Å or more.

A material having an etching selectivity relative to a third interlayer dielectric layer successively formed in a subsequent process, e.g., nitride, is deposited on the bit lines 30 and the second interlayer dielectric layer 24. The material is anisotropically etched to form bit line spacers 32 on sidewalls of the bit lines 30. Since the etching process of forming the bit line spacers 32 composed of nitride is performed directly after formation of the bit lines 30, a surface of the bit line mask layer 28 composed of identical material, i.e., nitride, is partially damaged.

The third interlayer dielectric layer 34, composed of boro-phospho-silicate glass (BPSG), undoped silicate glass (USG), high density plasma (HDP) oxide, or chemical vapor deposited (CVD) oxide, is formed on an entire surface of the resultant structure. The third interlayer dielectric layer 34 is planarized by a CMP process or an etch-back process.

Referring to FIGS. 2A and 2B, with a photo process, photoresist patterns (not shown) for defining storage node contact hole regions are formed on the third dielectric layer 34. Using an etching gas having a high etching selectivity relative to the bit line spacers 32 composed of nitride, the third interlayer dielectric layer 34 and the second interlayer dielectric layer 24 are dry etched to form the storage node contact holes 36 exposing the SAC pads 22a on the source regions. In this case, the interlayer dielectric layers 34 and 24 should be over etched so as to prevent the storage node contact holes 36 from being not opened. Accordingly, recesses of the bit line mask layer 28 are generated to deteriorate shoulder portions between the bit lines 30 and the storage node contact holes 36.

After removing the photoresist patterns, a second conductive layer composed of doped polysilicon is formed to fill up the storage node contact holes 36, the second conductive layer is separated into node units by a CMP process or an etch-back process, thereby forming storage node contact pads 38 separated into node units in the storage node contact holes 36.

According to the conventional method, a thickness of the bit line mask layer 28 composed of nitride should be increased so as to ensure an SAC process margin so that a height of the bit line 30 may increase. On the contrary, as a design rule of the pattern decreases to about 0.1 um or less, a space between adjacent bit lines 30 becomes smaller, thereby increasing an aspect ratio of the bit line 30. Additionally, when the third interlayer dielectric layer 34 is formed in a state in which the bit line spacers 32 are formed on the sidewalls of the bit lines 30, the space between the bit lines 30 becomes so narrow that the aspect ratio of the bit lines 30 greatly increases. As a result, a gap between the bit lines 30 may be not fully filled with the third interlayer dielectric layer 34 and voids may be generated in the third interlayer dielectric layer 34.

When the voids are formed in third interlayer dielectric layer 34 as described above, the voids may expand during a subsequent cleaning process. Hence, when the second conductive layer for the storage node contact pad is formed, the second conductive layer may penetrate into the enlarged voids so that the storage node contact pad 38 may be connected to an adjacent storage node contact pad 38. As a result, a bridge may be generated between the storage node contact pads 38.

When the thickness of the bit line mask layer 28 increases to ensure the SAC process margin, a thickness of the photoresist film for forming the bit lines should be augmented, thereby causing the lifting of the bit line 30 due to the photoresist film falling down.

Furthermore, since the bit line mask layer 28 may be damaged during the etching processes of forming the bit line spacers 32 and forming the storage node contact holes 36, the bit lines 30 are electrically short-circuited relative to the storage node contact pads 38, thereby generating single bit failures.

The bit lines correspond to wirings for detecting the existence of charges stored on memory cells of the DRAM device. The bit lines are generally connected to sense amplifiers positioned in a peripheral circuit region of the DRAM device. The variation of the bit line voltage is detected by detecting the charges stored on the memory cells, and the voltage variation increases accordingly as a storage capacitance of the memory cell increases or a bit line loading capacitance decreases. Accordingly, since the decrease of the bit line loading capacitance improves a sensitivity of the sense amplifier, it is preferable to decrease the bit line loading capacitance as much as possible for the improvement of reliability and response speed.

In the conventional method, a parasitic capacitance, i.e., the bit line loading capacitance between the bit line 30 and the storage node contact pad 38 or between the bit line 30 and an adjacent bit line 30, increases. This occurs because the bit-line spacers 32 composed of nitride having a high dielectric constant are formed on the sidewalls of the bit lines 30 to ensure the shoulder margin of the bit lines in accordance with the SAC process. Because a capacitance of a capacitor increases in accordance with a decrease of a thickness thereof, the thickness of the bit line spacer 32 becomes smaller as the design rule of the pattern decreases, thereby greatly increasing the bit line loading capacitance. Thus, the number of the bit lines constituting a cell array of the DRAM device should be reduced considering the bit line loading capacitance, which results in a reduction of cells per unit bit line and deteriorates chip efficiency.

In U.S. Pat. No. 6,458,692 and Japanese Laid Open Patent Publication No. 2001-217405, there are disclosed methods of forming contacts wherein spacers composed of silicon oxide having a low dielectric constant are formed on sidewalls of bit lines so as to reduce a bit line loading capacitance. However, the reduction of the thickness of a bit line mask layer may be limited to decrease the gap-fill margin of an interlayer dielectric layer. Additionally, there is scarcely any shoulder margin of the bit line, which results in a generation of an electrical short-circuit between the bit line and a storage node contact pad.

Embodiments of the invention address these and other limitations of the prior art.

SUMMARY OF THE INVENTION

Embodiments of the invention provide a semiconductor device wherein a gap formed between bit lines is effectively filled without generations of voids, a shoulder margin of a bit line is augmented, and a bit line loading capacitance is reduced.

Embodiments of the invention provide a method of manufacturing a semiconductor device that effectively fills a gap generated between bit lines without voids, increases the shoulder margin of the bit line, and reduces the bit line loading capacitance.

BRIEF DESCRIPTION OF THE DRAWINGS

The above features and advantages of the invention will become more readily apparent by describing in detail exemplary through the following detailed description of preferred embodiments thereof, made with reference to the attached drawings.

DETAILED DESCRIPTION OF THE INVENTION

Figure 1A:
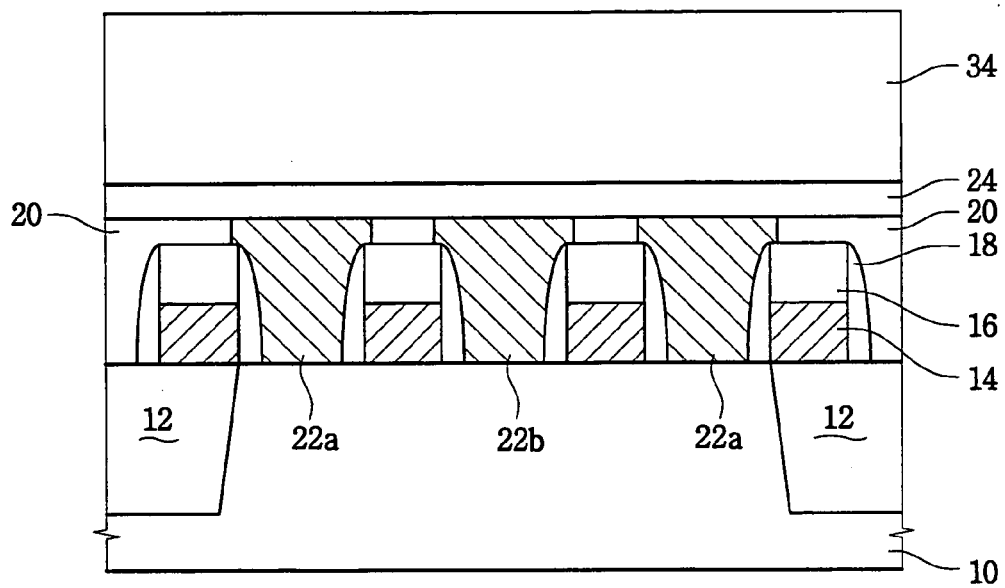
FIGS. 1A, 1B, 2A, and 2B are cross-sectional diagrams illustrating a method of manufacturing a DRAM device having a self-aligned contact structure according to a conventional method.
Figure 1B:
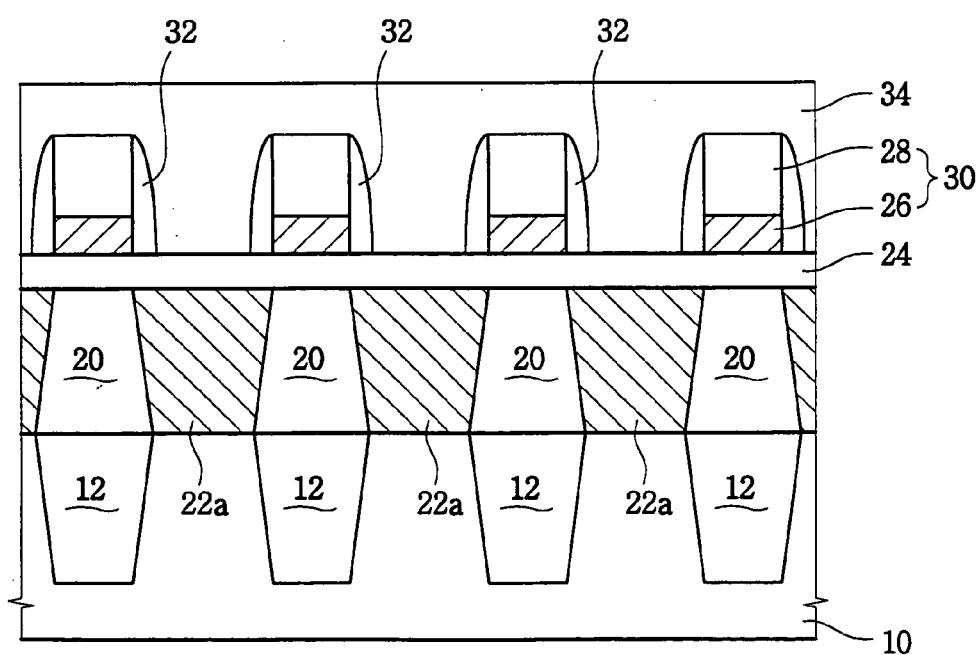
Figure 2A:
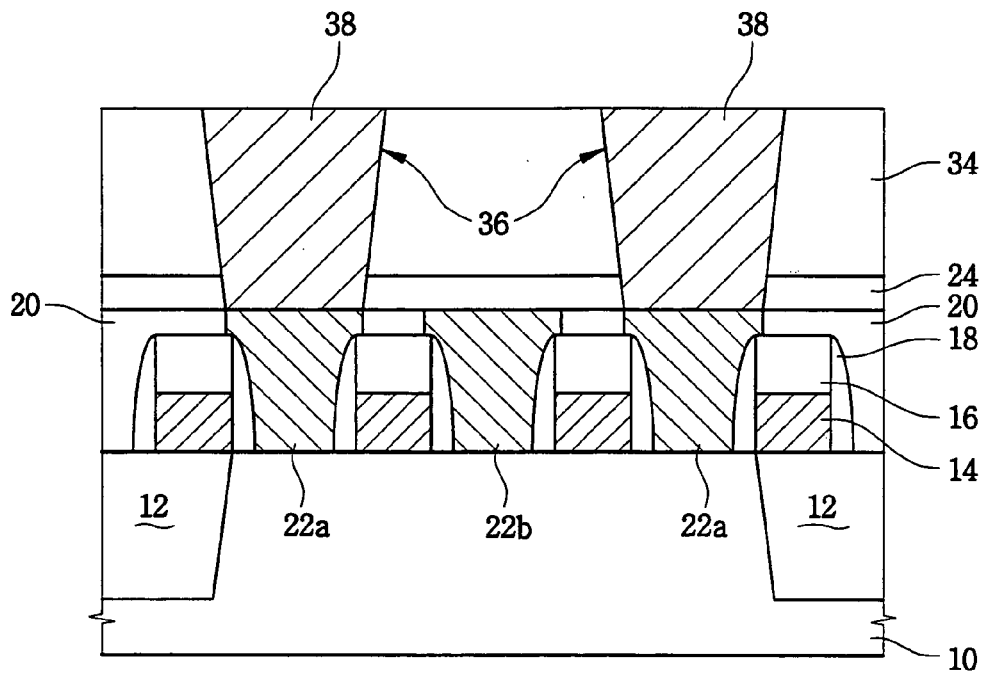
Figure 2B:
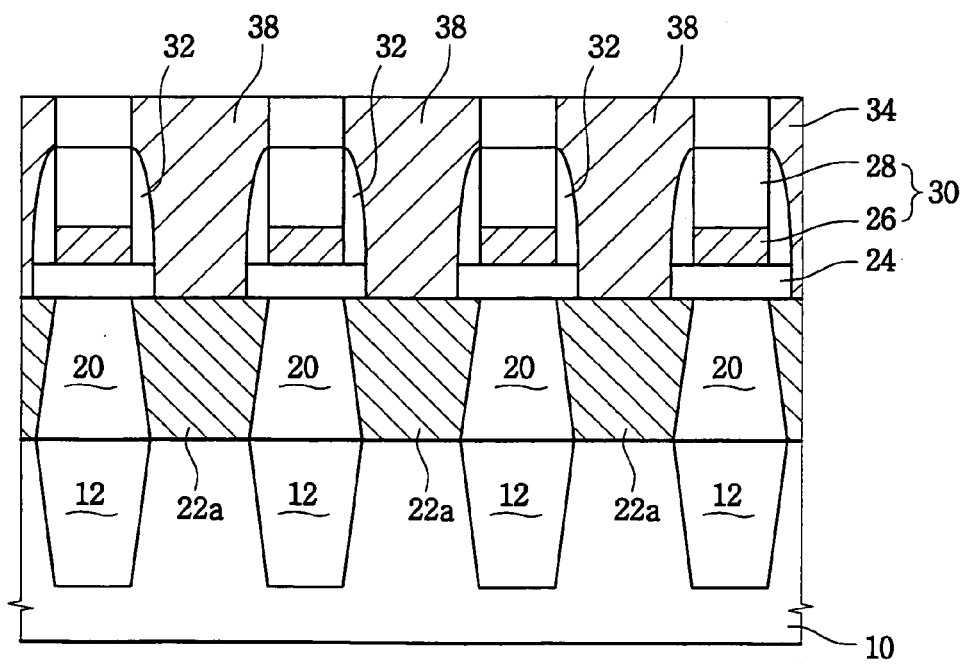

It should be understood that exemplary embodiments of the invention described below may be varied modified in many different ways without departing from the inventive principles disclosed herein, and the scope of the invention is therefore not limited to these particular following embodiments. Rather, these embodiments are provided so that this disclosure will be thorough and complete, and will fully convey the concept of the invention to those skilled in the art by way of example and not of limitation.

Hereinafter embodiments of the invention will be explained with reference to the accompanying drawings. In the drawings, like reference numerals identify similar or identical elements.

FIGS. 3A–3C, 4A–4D, 5A–5D, 6A–6D, 7A–7D, 8A–8D, and 9A–9D are plan diagrams and cross-sectional diagrams illustrating a method of manufacturing a DRAM device according to an embodiment of the invention.

Figure 3A:
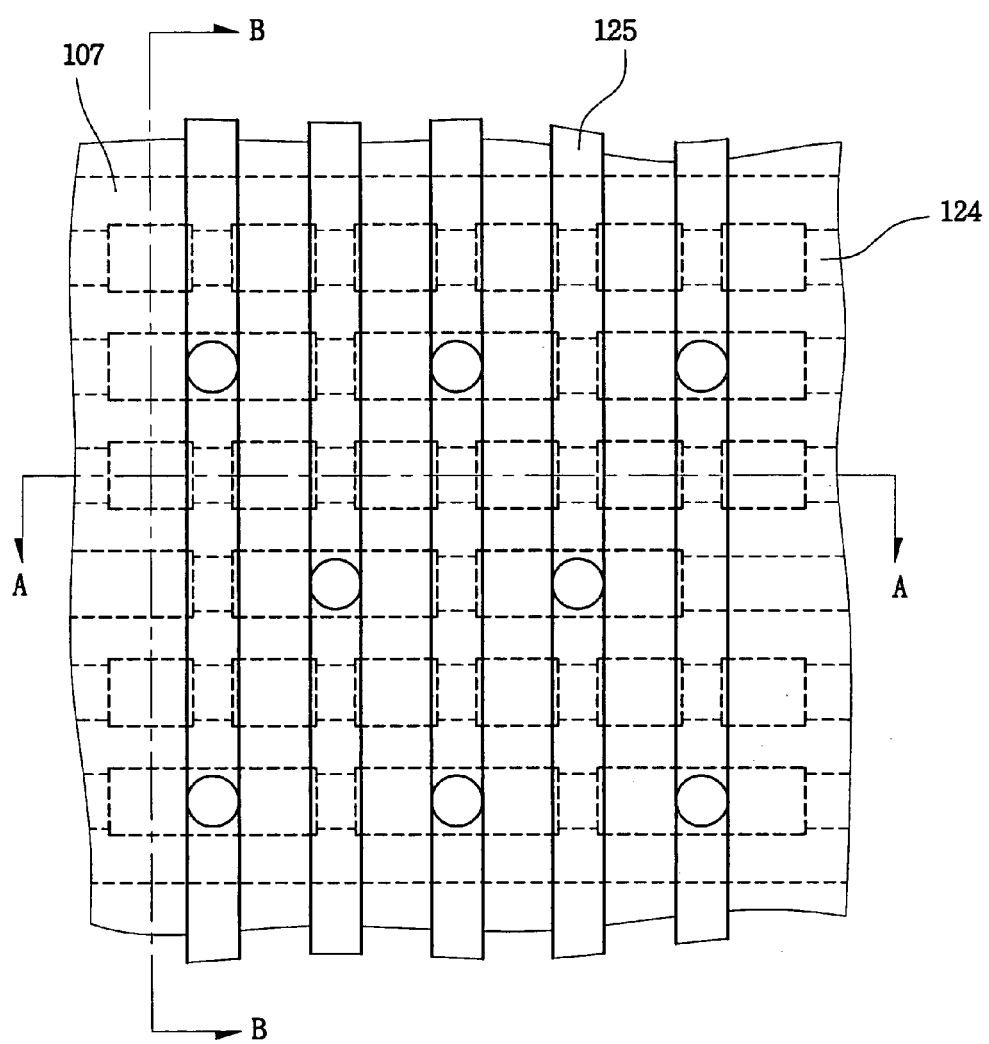
FIGS. 3A–3C, 4A–4D, 5A–5D, 6A–6D, 7A–7D, 8A–8D, and 9A–9D are plan diagrams and cross-sectional diagrams illustrating a method of manufacturing a DRAM device in accordance with an embodiment of the invention.
Figure 3B:
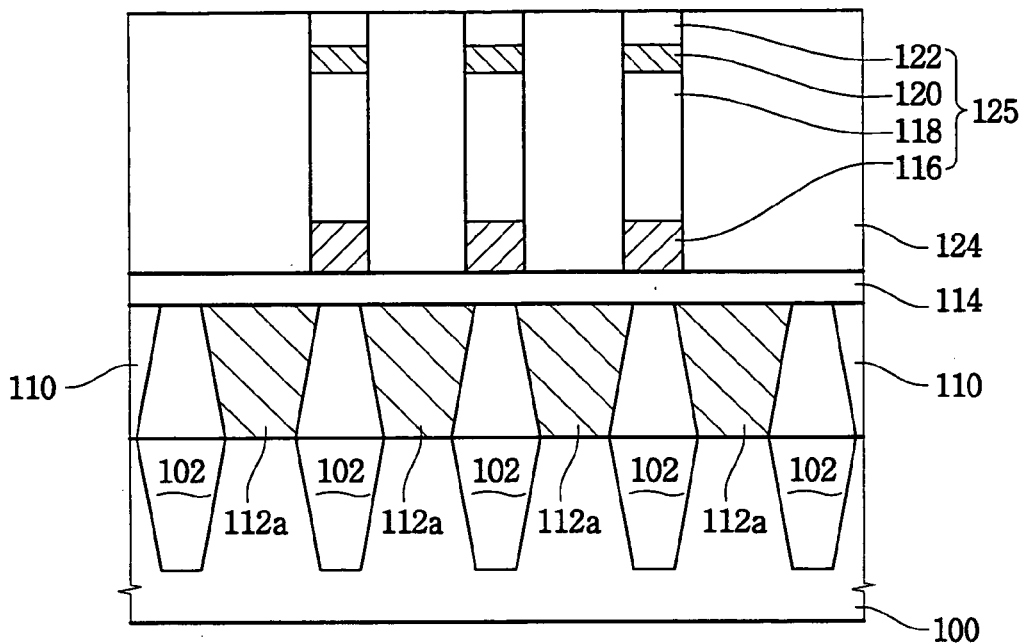
Figure 3C:
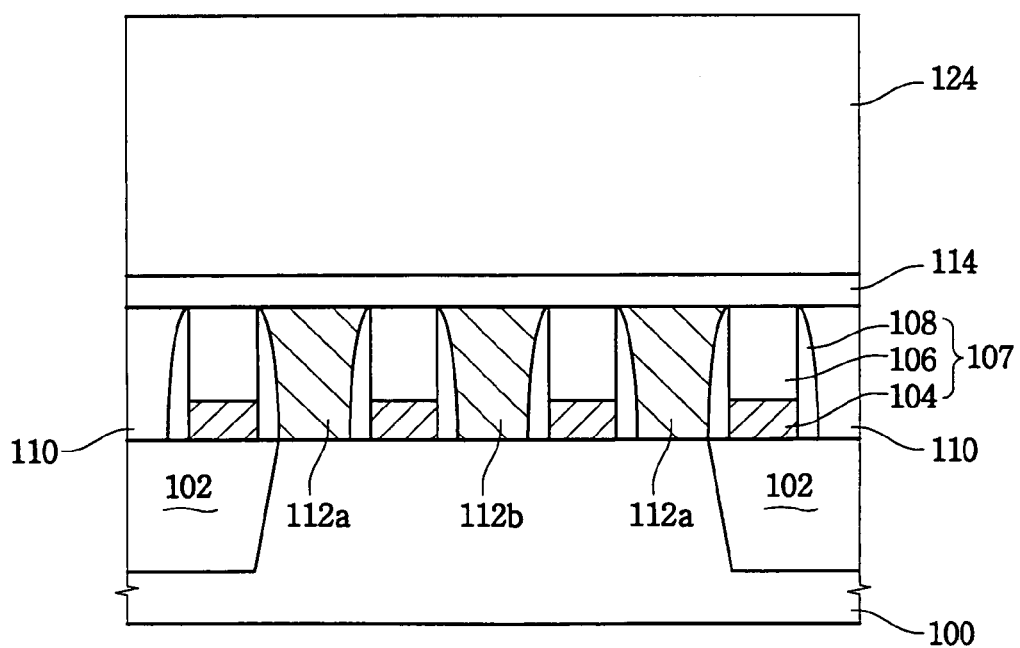

FIG. 3A is a plan diagram of a semiconductor substrate 100 on which word lines 107 and bit lines 125 are formed, while FIGS. 3B and 3C are cross-sectional diagrams taken along lines A–A' and B–B' in FIG. 3A, respectively.

Referring to FIGS. 3A to 3C, using an isolation process like a shallow trench isolation (STI) process, isolation regions 102 are formed on the semiconductor substrate 100 to define active regions on the semiconductor substrate 100. Each of the active regions has a shape of a bar or T.

After growing a thin gate oxide layer (not shown) in the active region by a thermal oxidation process, a gate conductive layer and a gate mask layer are sequentially formed on the gate oxide layer. Preferably, the gate conductive layer is formed to have a polycide structure including a doped polysilicon layer and a metal silicide layer formed on the polysilicon layer. The gate mask layer is formed using a material having an etching selectivity relative to an interlayer dielectric layer successively formed in a subsequent process. Preferably, the gate mask layer is formed using a nitride based material.

The gate mask layer and the gate conductive layer are patterned by a photolithographic process to form the word lines 107 including gate mask patterns 106 and gate conductive patterns 104. Particularly, the gate mask layer and the gate conductive layer are simultaneously patterned using a photoresist mask. Alternatively, after patterning the gate mask layer using the photoresist mask and removal of the photoresist mask, the gate conductive layer is patterned using the patterned gate mask layer corresponding to gate mask patterns 106.

Upon an entire surface of the substrate 100 where the word lines 107 are formed, an insulating layer is formed using a material having an etching selectivity relative to an interlayer dielectric layer that is successively formed thereon in a subsequent process. Preferably, an insulating layer composed of a nitride based material is formed on the substrate 100. The insulating layer is anisotropically etched to form gate spacers 108 on sidewalls of the word lines 107, respectively. Because each of the word lines 107 is surrounded by the gate mask pattern 106 and the gate spacer 108, the word line 107 is electrically isolated from an adjacent word line 107.

Source/drain regions (not shown) of MOS transistors are formed in the active regions exposed between the gate spacers 108 by an ion implantation process. At this time, before forming the gate spacers 108, a lightly doped drain (LDD) ion implantation process is carried out to form lightly doped source/drain regions in the active regions exposed between the word lines 107 so that the source/drains having LDD structures. Some source/drain regions correspond to capacitor contact regions where storage electrodes of capacitors are electrically connected. Other source/drain regions correspond to bit line contact regions to which bit line are electrically connected.

The interlayer dielectric layer 110 is formed on an entire surface of the substrate 100 having the MOS transistors formed thereon. The interlayer dielectric layer 110 is formed using an oxide based material. The interlayer dielectric layer 110 is planarized by a CMP process, an etch-back process, or a mixed process using both a CMP process and an etch-back process.

The interlayer dielectric layer 110 is anisotropically etched to form contact holes self-aligned relative to the word lines 108 using an etching gas having a high etching selectivity relative to the gate mask pattern 108 composed of nitride. The contact holes expose the source/drain regions of the MOS transistors, respectively.

After forming a polysilicon layer doped with impurity by a high concentration to fill the contact holes, the polysilicon layer and the interlayer dielectric layer 110 are planarized by a CMP process, an etch-back process or a mixed process of a CMP and an etch-back. As a result, SAC pads 112a and 112b separated into node units are formed in the contact holes, respectively. In this embodiment, some SAC pads 112a are electrically connected to the source regions corresponding to the capacitor contact regions while other SAC pads 112b are connected to the drain regions corresponding to the bit line contact regions.

After forming the SAC pads 112a and 112b, an oxide based material like BPSG, USG, HDP oxide, CVD oxide, etc., is deposited on an entire surface of the resultant structure by a thickness of about 1,000~3,000 Å, preferably about 2,000 Å, thereby forming a first insulating layer 114. To ensure a process margin of a subsequent photo process, a surface of the first insulating layer 114 is planarized by a CMP process, an etch-back process or a mixed process of a CMP and an etch-back. At this time, a planarization the first insulating layer 114 should be carried out such that the first insulating layer 114 remains beneath bit lines 125 successively formed by a thickness of about 1,000~2,000 Å. The first insulating layer 114 serves as an interlayer dielectric layer for isolating the SAC pads 112a and 112b from the bit lines 125 formed thereon.

With a photolithographic process, the first insulating layer 114 is etched to form bit line contact holes (not shown) exposing the SAC pads 112b on the drain regions. A first conductive layer, a bit line mask layer, a first buffer layer, and a second buffer layer are sequentially formed on an entire surface of the resultant structure.

Preferably, the first conductive layer is formed as a composite layer including a first film composed of a first metal and/or a compound of the first metal, e.g., titanium (Ti)/titanium nitride (TiN), and a second film composed of a second metal, e.g., tungsten (W). The bit line mask layer protects the underlying first conductive layer during a subsequent etching process for forming storage node contact holes. The bit line mask layer includes a material having an etching selectivity relative to a second insulating layer successively formed. The bit line mask layer is preferably formed using nitride. The first buffer layer protects the underlying bit line mask layer during a subsequent process of partially etching the second insulating layer. The first buffer layer is formed using a material having an etching selectivity relative to the second insulating layer and having an etching rate substantially similar to that of a second conductive layer for storage node contact pads successively formed in a subsequent process. The first buffer layer is preferably formed using polysilicon. The second buffer layer prevents formation of a recess on the first buffer layer when the first conductive layer is etched in a subsequent process of forming the bit line 125. The second buffer layer is formed using a material having an etching selectivity relative to the first buffer layer 120. Preferably, the second buffer layer is composed of oxide.

The second buffer layer, the first buffer layer, the bit line mask layer and the first conductive layer are patterned by a photolithographic process so that the bit lines 125 having a multi-layered structure are formed on the first insulating layer 114. Each of the bit lines 125 includes a first conductive pattern 116, a bit line mask pattern 118, a first buffer layer pattern 120 and a second buffer layer pattern 122. The bit lines 125 are perpendicular to the word lines 107, respectively. The first conductive pattern 116 corresponds to a bit line conductive pattern.

As described above, each of the first conductive patterns 116 including two films is formed to directly contact with the bit line contact hole. Alternatively, bit line contact pads are formed in the bit line contact holes and the first conductive patterns 116 are to directly contact with the bit line contact pads.

Particularly, a barrier metal layer composed of Ti/TiN and a third metal film composed of W are formed on an entire surface of the resultant structure including the bit line contact holes. The third metal layer is etched by a CMP process or an etch-back process when a surface of the first insulating layer 114 is exposed. As a result, there are formed the bit line contact pads including the barrier metal layer and the third metal film in the bit line contact holes. After forming the bit line contact pads, the first conductive layer composed of a fourth metal, e.g., W, is formed on the resultant structure. When the bit line contact pads are additionally formed, the first conductive layer includes one film.

An oxide-based material like BPSG, USG, HDP oxide, CVD oxide, etc., is deposited on the bit lines 125 and the first insulating layer 114 to form the second insulating layer 124. The second insulating layer 124 is planarized by a CMP process, an etch-back process or a mixed process of a CMP and an etch-back when surfaces of the bit lines 125 are exposed. In case that the first conductive pattern 116 contains tungsten (W) and the second insulating layer 124 is formed using oxide deposited at a high temperature like HTO or oxide requiring a baking process at high temperature after depositing such as BPSG, SOG, etc., the tungsten in the first conductive pattern 116 is oxidized because a sidewall of the first conductive pattern 116 is exposed. To prevent an oxidation of the first conductive pattern 116, it is preferable that the second insulating layer 124 is formed using the HDP oxide that accomplishes a gap-fill without generating voids while the HDP oxide is deposited at a low temperature.

Additionally, to prevent voids from forming between adjacent bit lines 125, a nitride layer may be formed on the bit lines 125 to have a thickness of about 50~200 Å before forming the second insulating layer 124.

Figure 4A:
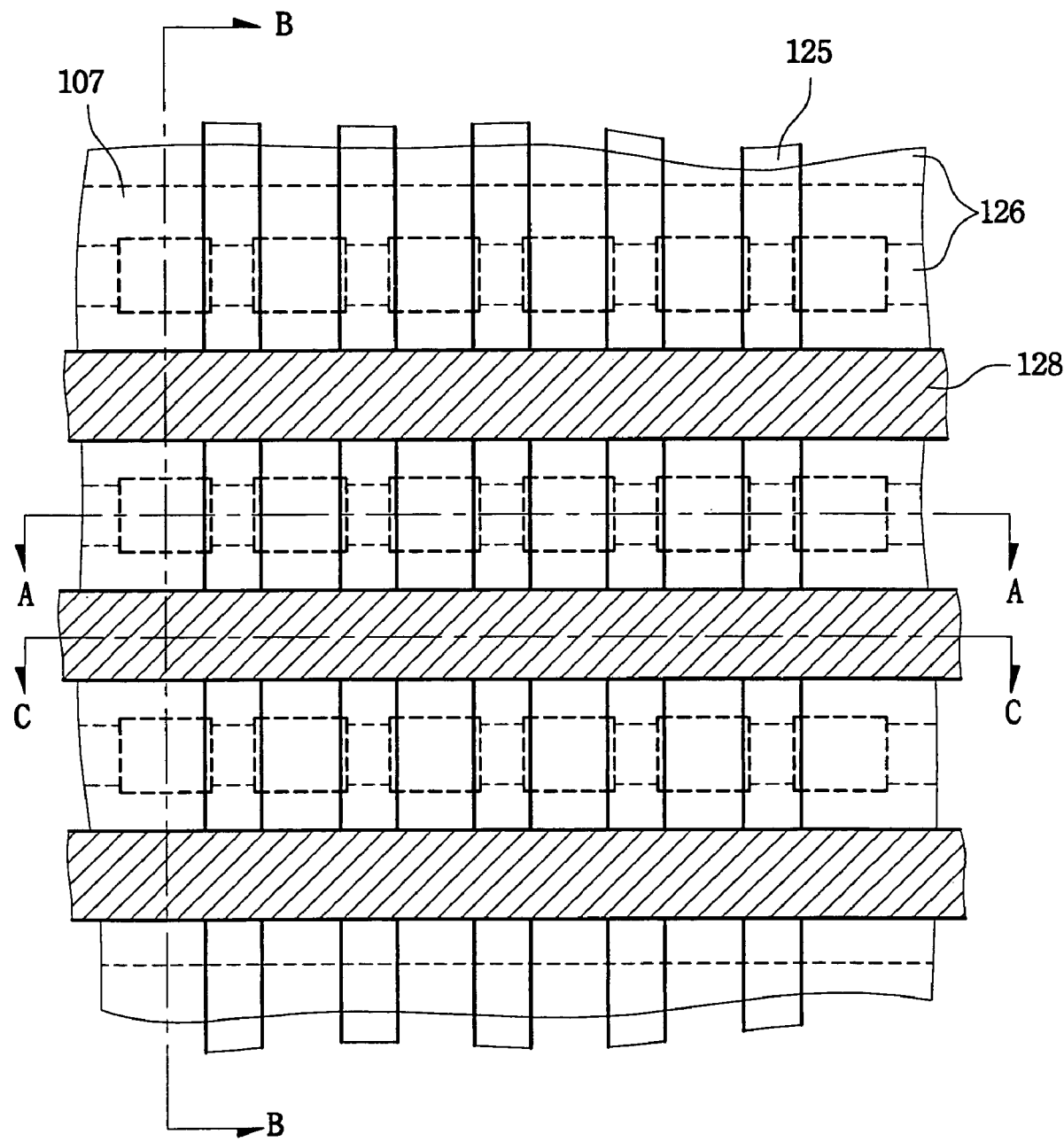
Figure 4B:
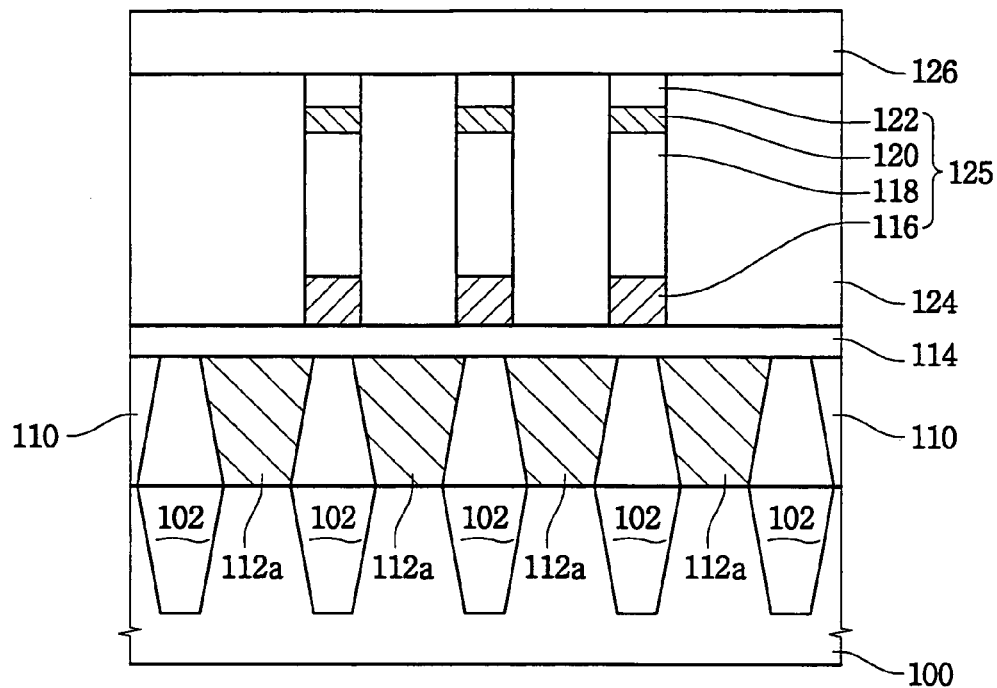
Figure 4C:
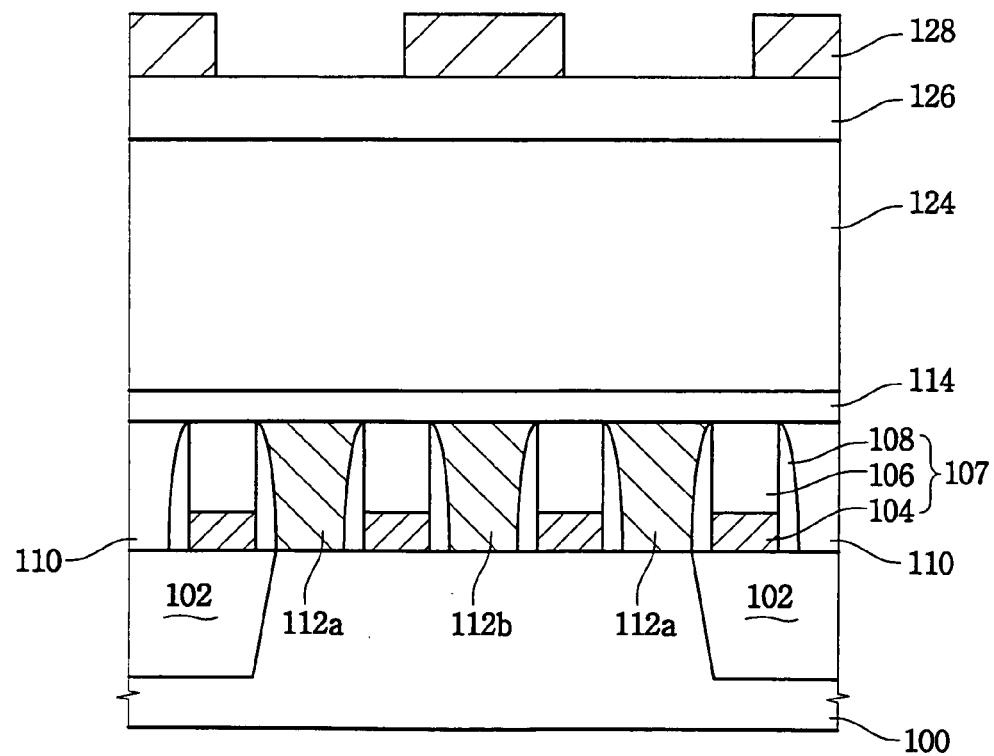
Figure 4D:
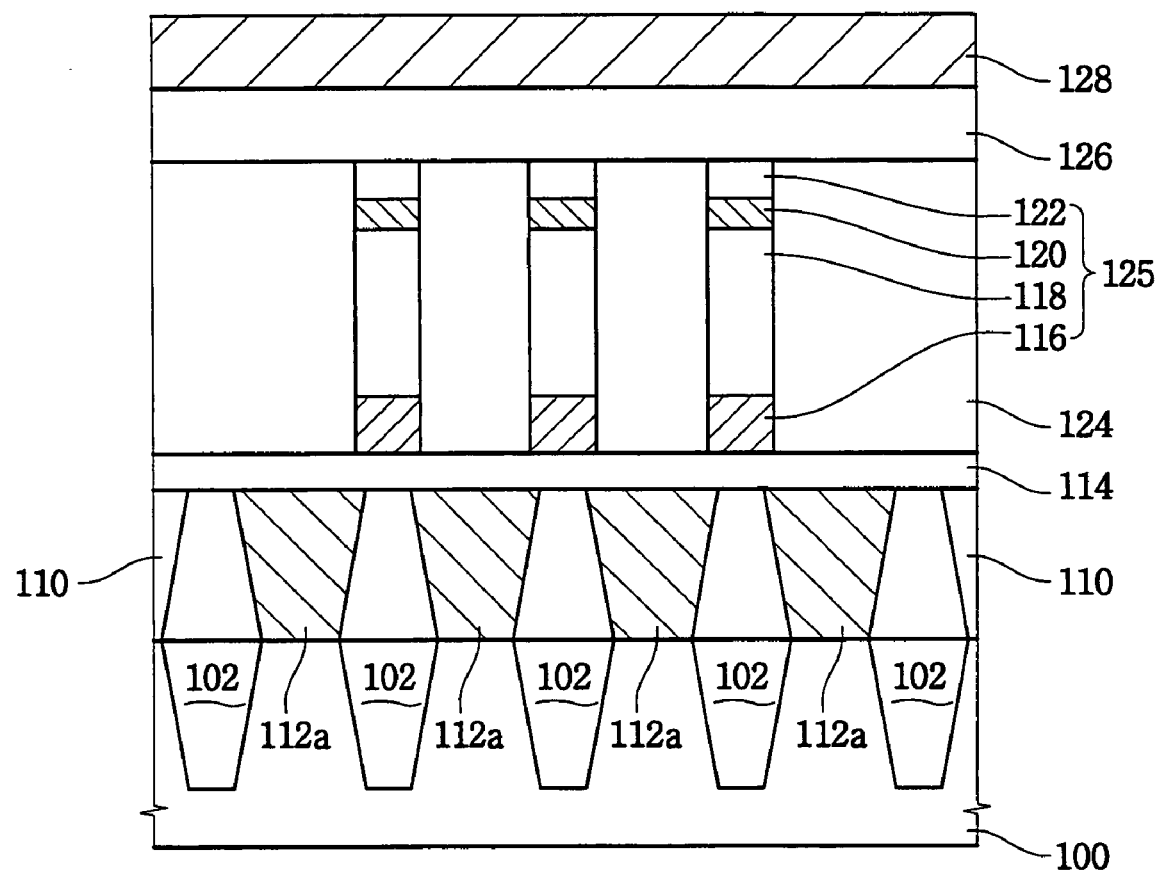

FIG. 4A is a plan diagram of the substrate 100 on which a sacrificial layer 126 and contact patterns 128 are formed, and FIGS. 4B, 4C, and 4D are cross-sectional diagrams taken along lines A–A', B–B', and C–C' in FIG. 4A, respectively.

Referring to FIGS. 4A to 4C, an oxide having an etching rate that is faster than that of the second insulating layer 124 is deposited on the planarized second insulating layer 124 and the bit lines 125 so that a sacrificial layer 126 is formed on the second insulating layer 124 and on the bit lines 125. For example, if the second insulating layer 124 is formed using HDP oxide, the sacrificial layer 126 is formed using BPSG having a high concentration. The sacrificial layer 126 reduces a loss of the bit line mask pattern 118 during a subsequent planarization process for the second conductive layer to form storage node contact pads.

Accordingly, the sacrificial layer 126 protects the first conductive patterns 116 of the bit lines 125.

A material having an etching selectivity relative to the second insulating layer 124 and having an etching rate substantially similar to that of the second conductive layer for forming storage node contact pads in a subsequent process is deposited on the sacrificial layer 126, and then is patterned to form storage node contact patterns 128. Preferably, the storage node contact pattern 128 is formed using polysilicon. The storage node contact patterns 128 open portions of the sacrificial layer 126 where storage node contact holes are successively formed. The storage node contact patterns 128 augment a process margin of a subsequent photo process. In addition, during a subsequent process of partially etching the second insulating layer 124, the storage node contact patterns 128 are used as buffer regions (that is, regions corresponding to peripheral circuit/core regions in a direction of C–C' in FIG. 4A) where no storage node contact pads are formed. Preferably, the storage node contact patterns 128 have shapes of lines so that a plurality of storage node contact holes are adjacent to one another in a direction perpendicular to that of the bit lines 125 (i.e., the word line direction) are merged and opened throughout. The storage node contact patterns 128 having the line shapes can prevent a misalignment in a subsequent photo process and can settle an etch-stop disadvantage during a subsequent etching process for the storage node contacts because areas opened by the storage node contact patterns are relatively wide. Furthermore, the opened areas have identical sizes in a cell array region of the DRAM device in accordance with the line shaped contact patterns 128, thereby decreasing a thickness variation of the second insulating layer 124 during a subsequent etching process for the storage node contacts.

Figure 5A:
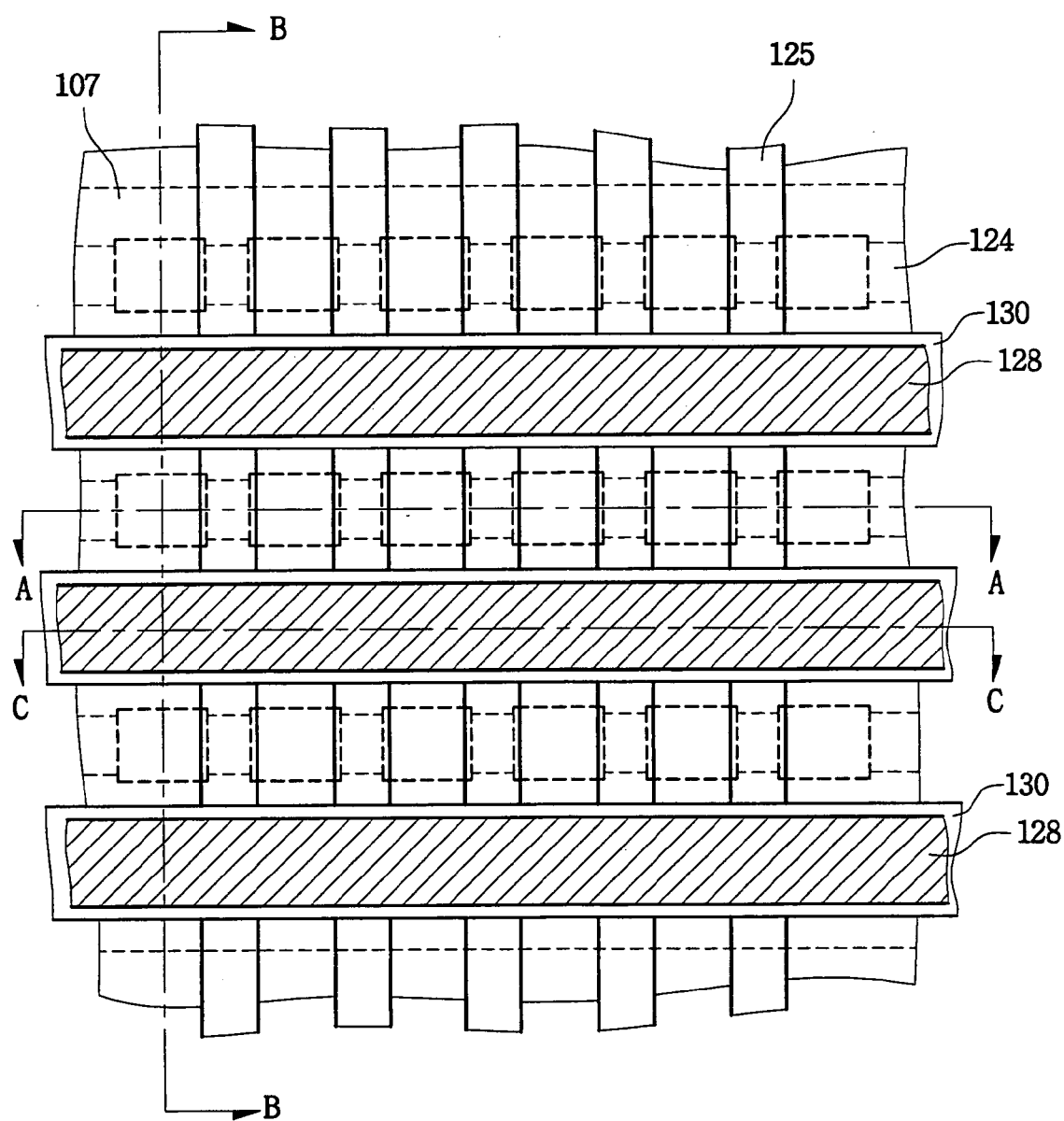
Figure 5B:
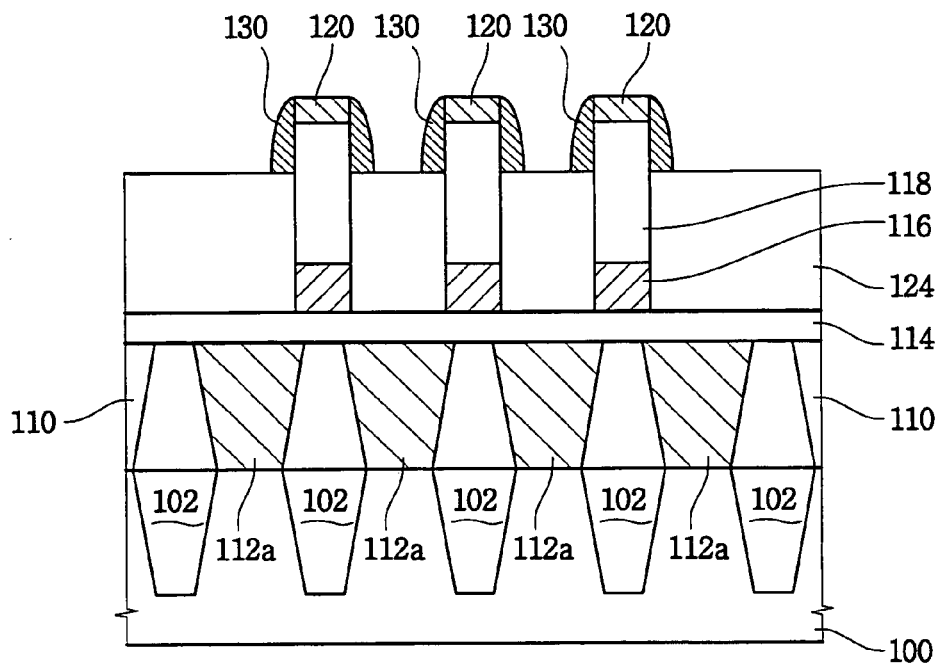
Figure 5C:
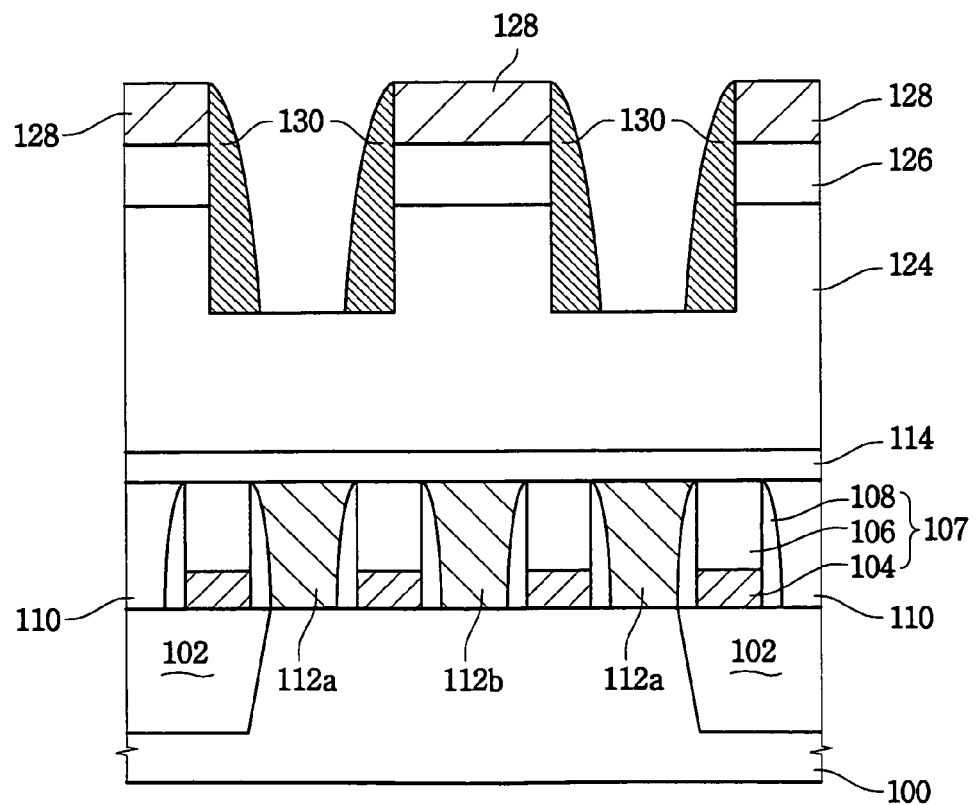
Figure 5D:
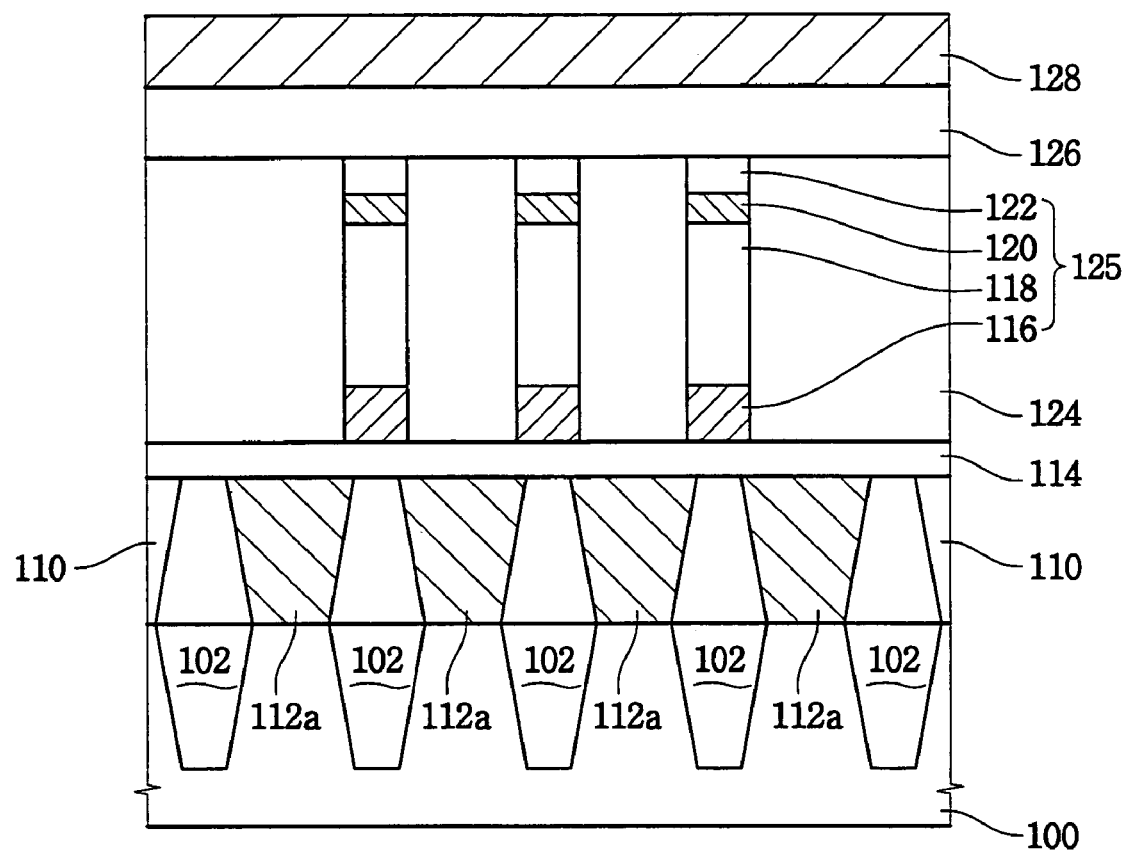

FIG. 5A is a plan diagram of the substrate 100 where first spacers 130 are formed, and FIGS. 5B, 5C, and 5D are cross-sectional diagrams taken along lines A–A', B–B' and C–C' in FIG. 5A, respectively.

Referring to FIGS. 5A to 5D, after forming the line shaped storage node contact patterns 128, the sacrificial layer 126 and the second insulating layer 124 are partially etched to predetermined portions over the first conductive pattern 116 by a time-etching process using the storage node contact patterns 128 as etching masks. Preferably, the etching process finishes at a point of the second insulating layer 124 that lies over the first conductive pattern by more than about 500 Å. The second buffer layer patterns 122 are removed in accordance with the etching process.

On an entire surface of the resultant structure, a material having an etching selectivity relative to the second insulating layer 124 and having an etching rate substantially similar to that of the second conductive layer for the storage node contact pads successively formed in a subsequent process, preferably polysilicon, is deposited to have a thickness of about 200~600 Å, and then is anisotropically etched to form first spacers 130 on sidewalls of the partially etched portions of the second insulating layer 124 and the sacrificial layer 126 and on sidewalls of the storage node contact patterns 128. In particular, the first spacers 130 composed of polysilicon are formed on sidewalls of the first buffer layer patterns 120 and on portions of sidewalls of the bit line mask patterns 118 of the bit lines 125.

Since the first spacers 130 are formed from the portions of the sidewalls of the bit line mask patterns 118 to the sidewalls of the first buffer layer patterns 120, second spacers are successively formed on the sidewalls of the bit lines 125 under the first spacers 130, thereby decreasing a bit line loading capacitance. When the first spacer 130 is formed using polysilicon, a loss of the bit line mask pattern 118 can be prevented and a shoulder margin can be ensured because polysilicon typically has a high etching selectivity relative to nitride and oxide. At this time, the first spacers 130 are not formed on the regions where no storage node contact pads are formed (i.e., the regions corresponding to the peripheral circuit/core regions in the direction of C–C' in FIG. 5A) because such regions are covered with the storage node contact patterns 128.

Figure 6A:
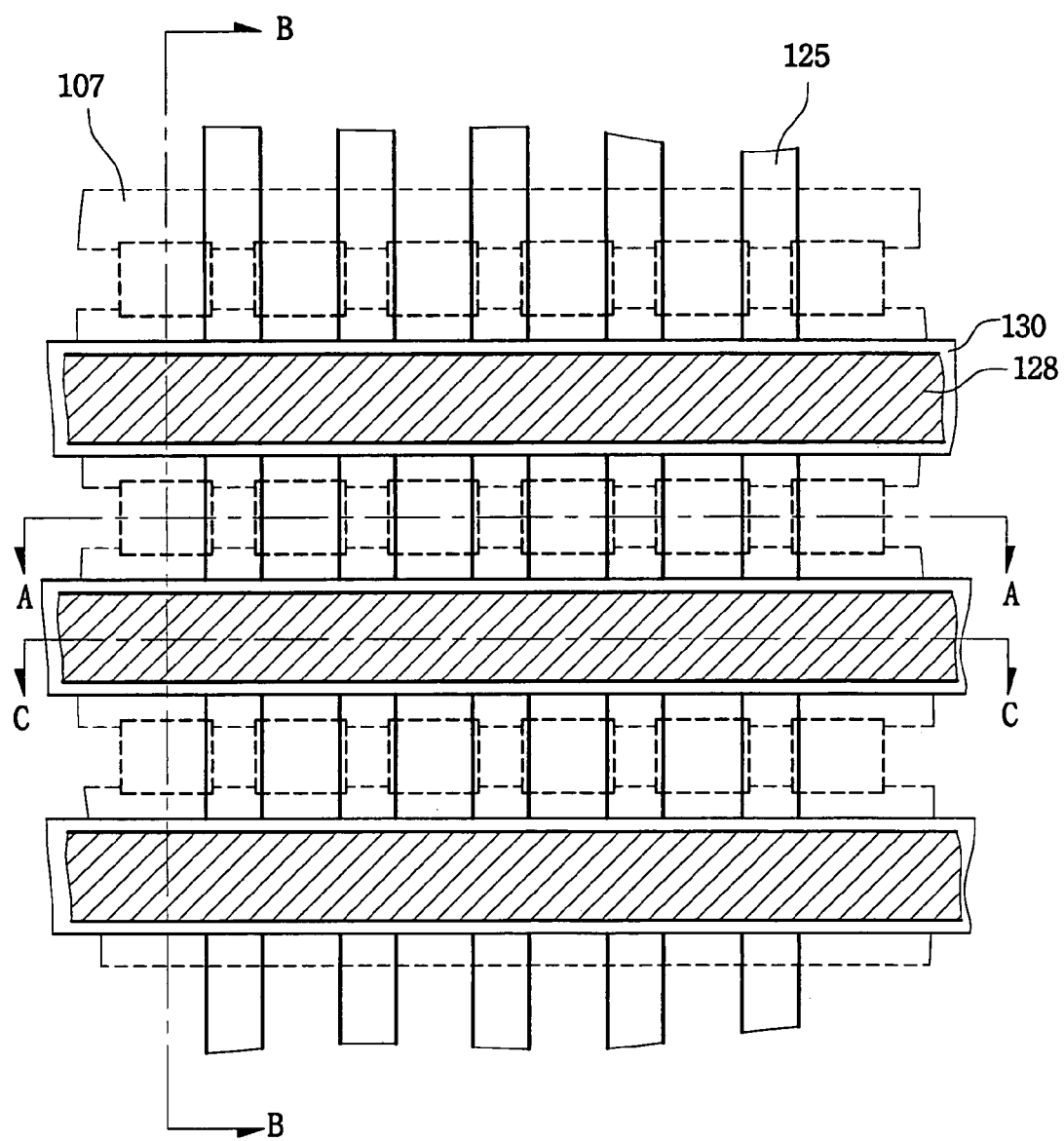
Figure 6B:
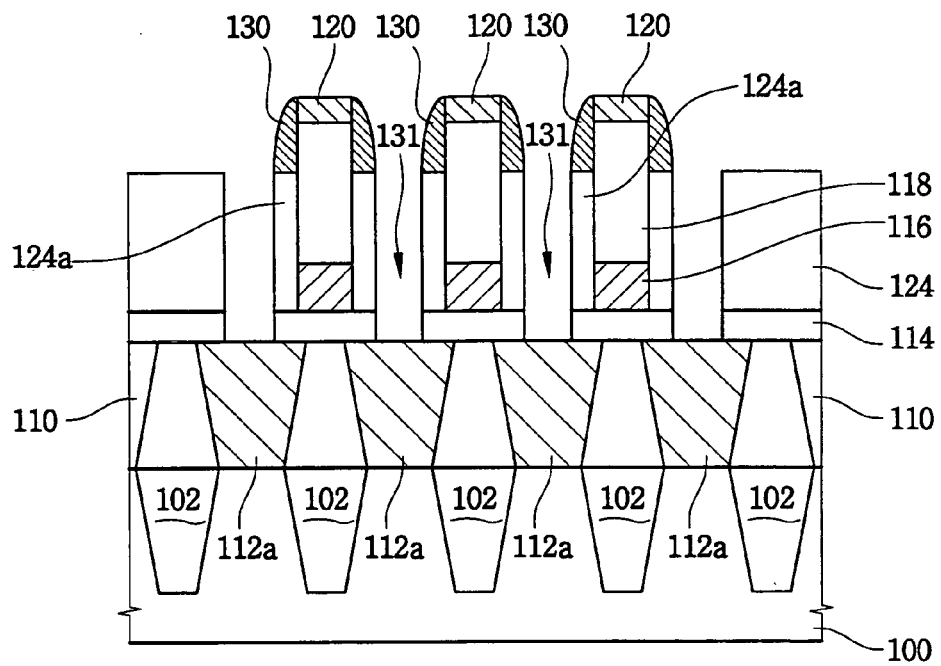
Figure 6C:
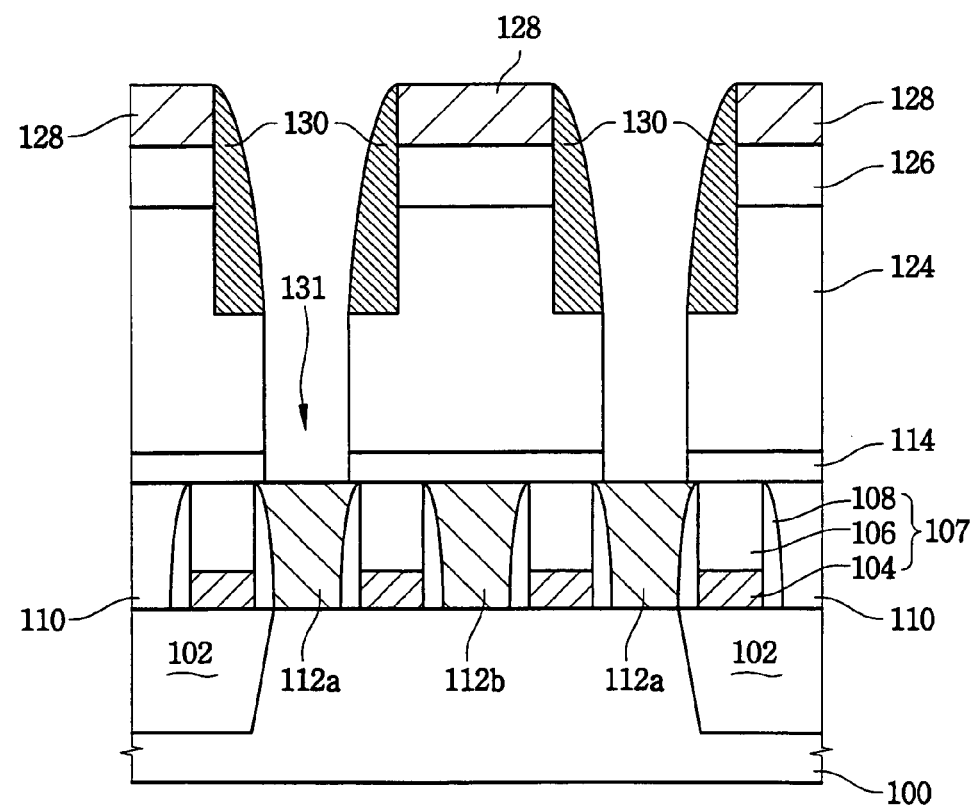
Figure 6D:
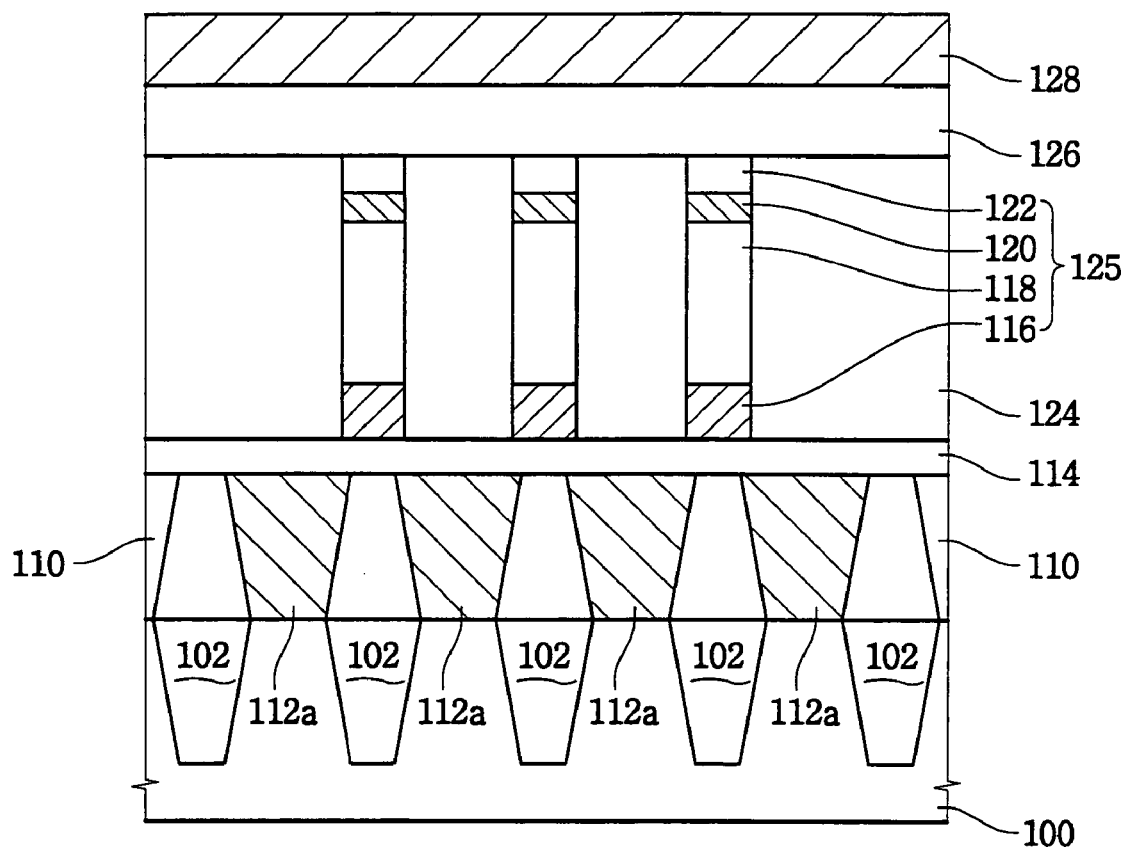

FIG. 6A is a plan diagram of the substrate 100 where storage node contact holes 131 are formed, and FIGS. 6B, 6C, and 6D are cross-sectional diagrams taken along lines A–A', B–B' and C–C' in FIG. 6A, respectively.

Referring to FIGS. 6A to 6D, using the first spacers 130 composed of polysilicon as etching masks, the second and first insulating layers 124 and 114 composed of oxides are dry etched to form the storage node contact holes 131 exposing the capacitor contact regions corresponding to the source regions where the SAC pads 112a are formed. Simultaneously, there are formed the second spacers 124a from the second insulating layer 124 on the sidewalls of the bit lines 125 beneath the first spacers 130. That is, the first spacers 130 composed of polysilicon are formed on upper portions of the sidewalls of the bit lines 125 while the second spacers 134 composed of oxide are formed on lower portions of the sidewalls of the bit lines 125. In this case, etching is not carried out in the regions where the storage node contact pads are not formed (i.e., the regions corresponding to the peripheral circuit/core regions in the direction of C–C' in FIG. 6A) because these regions are covered with the storage node contact patterns 128.

Figure 7A:
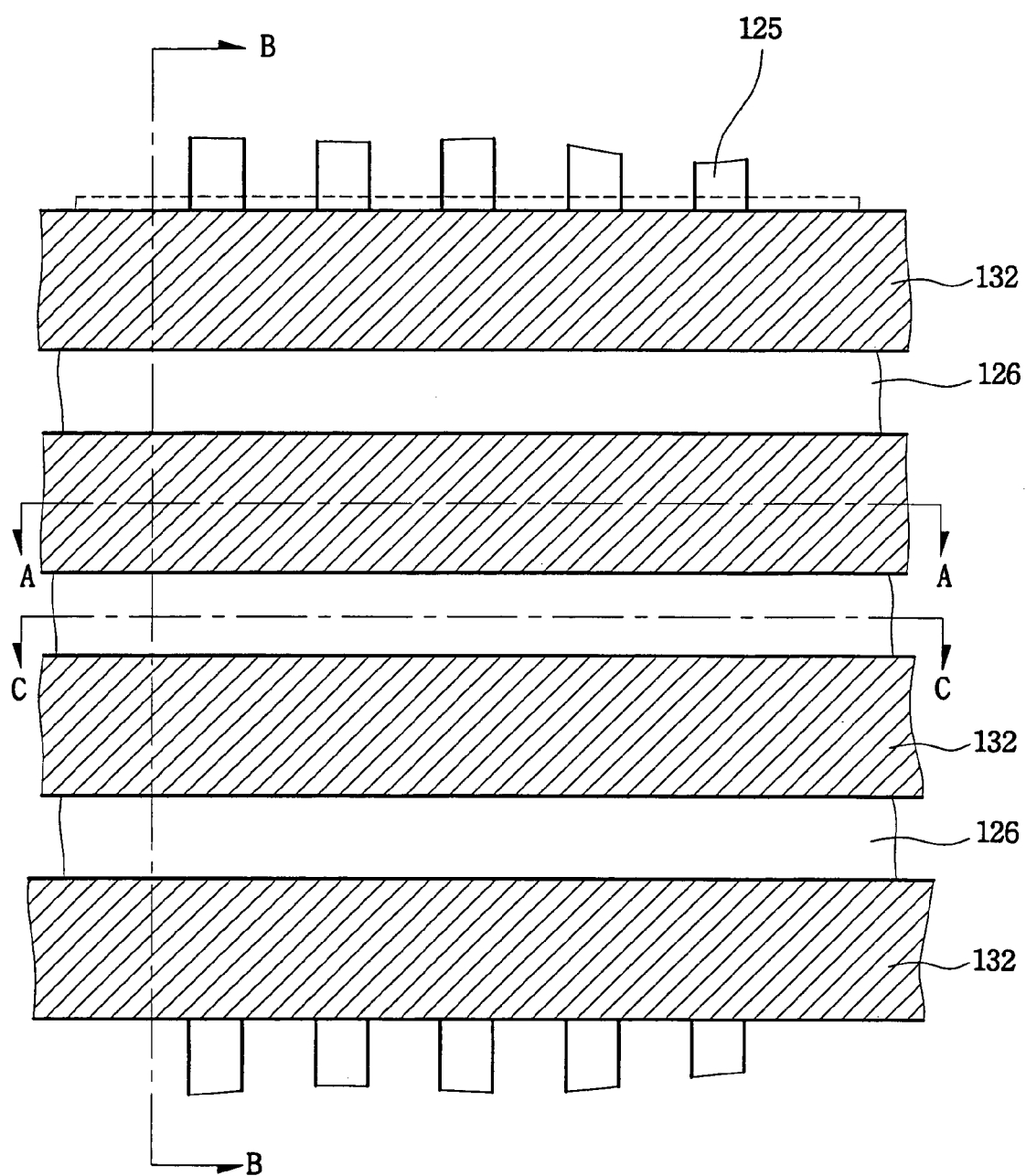
Figure 7B:
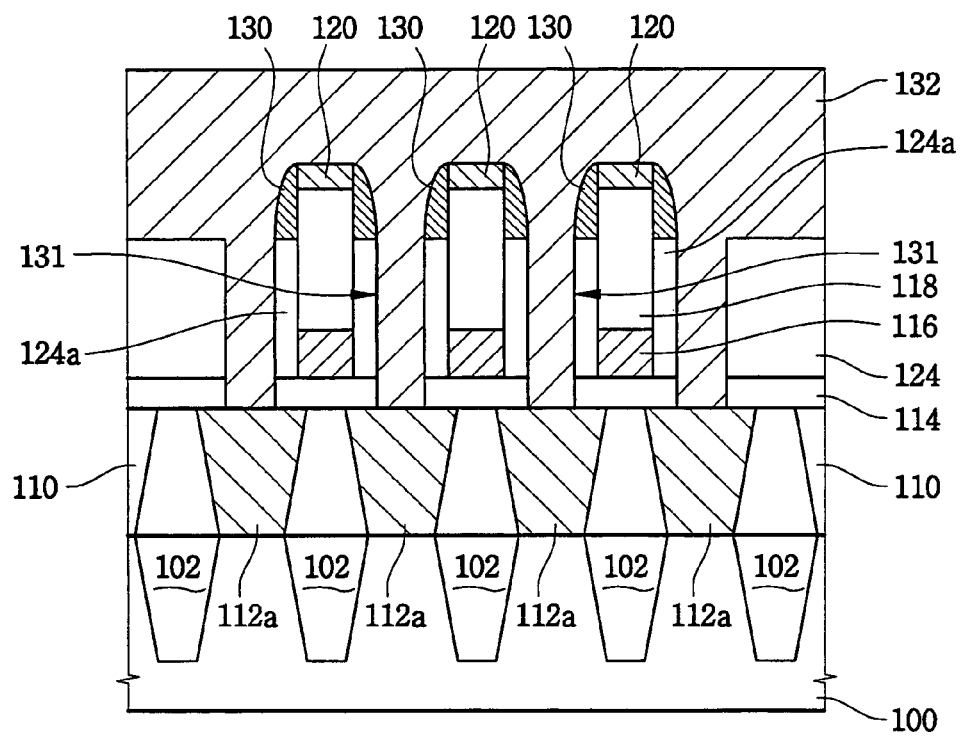
Figure 7C:
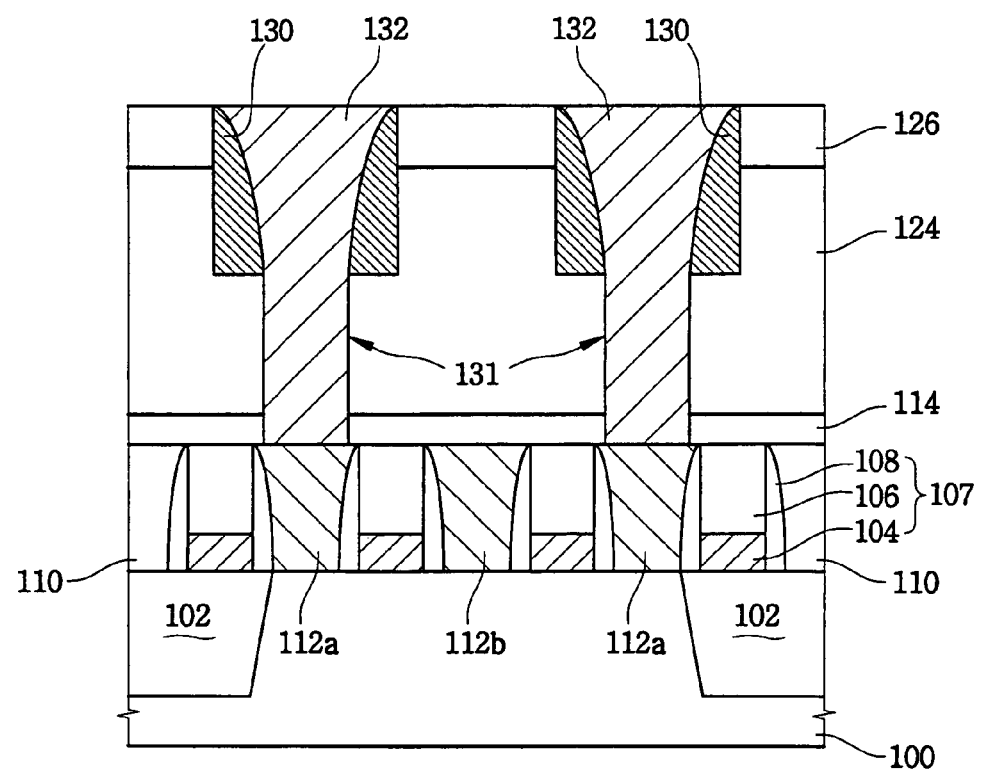
Figure 7D:
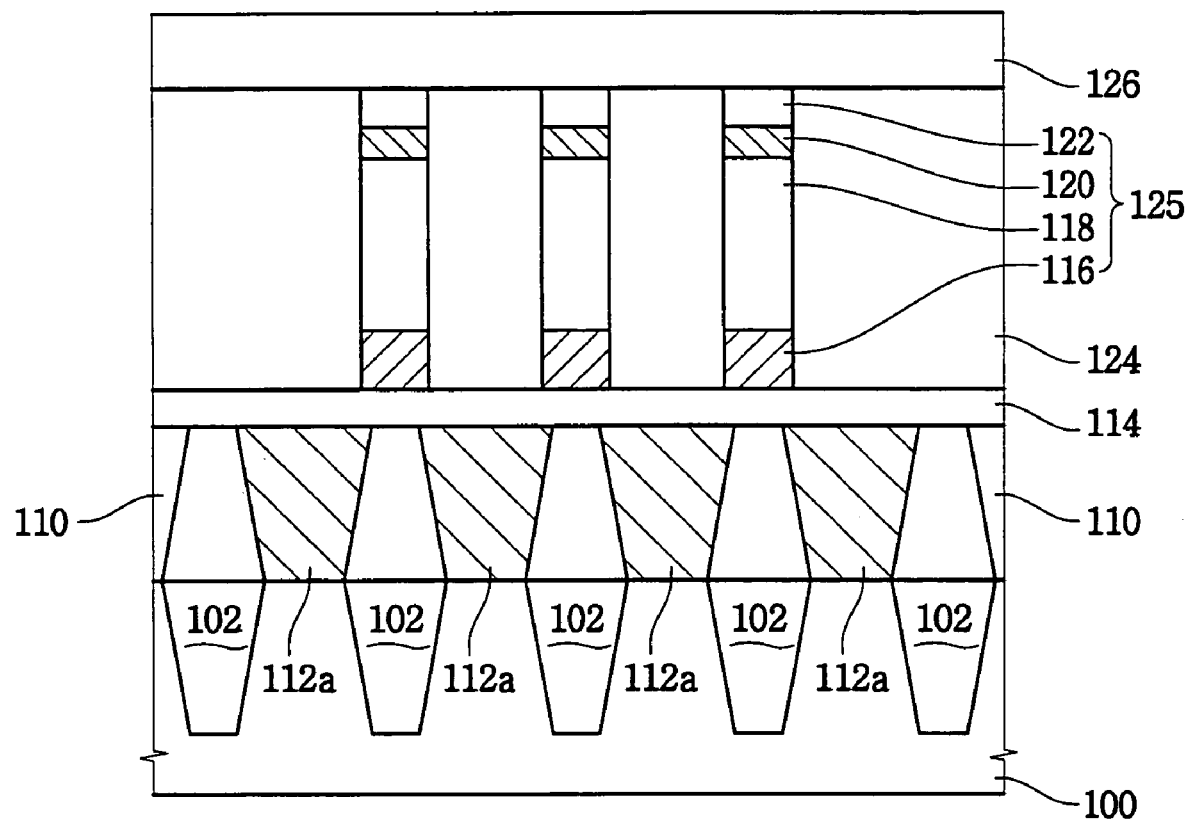

FIG. 7A is a plan diagram of the substrate 100 on which the second conductive layer 132 is formed, and FIGS. 7B, 7C, and 7D are cross-sectional views taken along lines A–A', B–B' and C–C' in FIG. 7A, respectively.

Referring to FIGS. 7A to 7D, after forming the storage node contact holes 131, a cleaning process is carried out to remove native oxide films grown on the SAC pads 112a exposed through the storage node contact holes 131, such as polymers, various particles, etc.

The second conductive layer 132, e.g., a polysilicon layer, is continuously formed on the bit lines 125, on the second insulating layer 124, and on the storage node contact patterns 128. The second conductive layer 132 fills up the storage node contact holes 131. The second conductive layer 132 is etched by a planarization process such as a CMP process, an etch-back process, or a mixed process of a CMP and an etch-back when a surface of the sacrificial layer 126 remaining in the regions where no storage node contact pad exists is exposed. With the above planarization process, the storage node contact patterns 128 composed of polysilicon are removed at the same time.

Figure 8A:
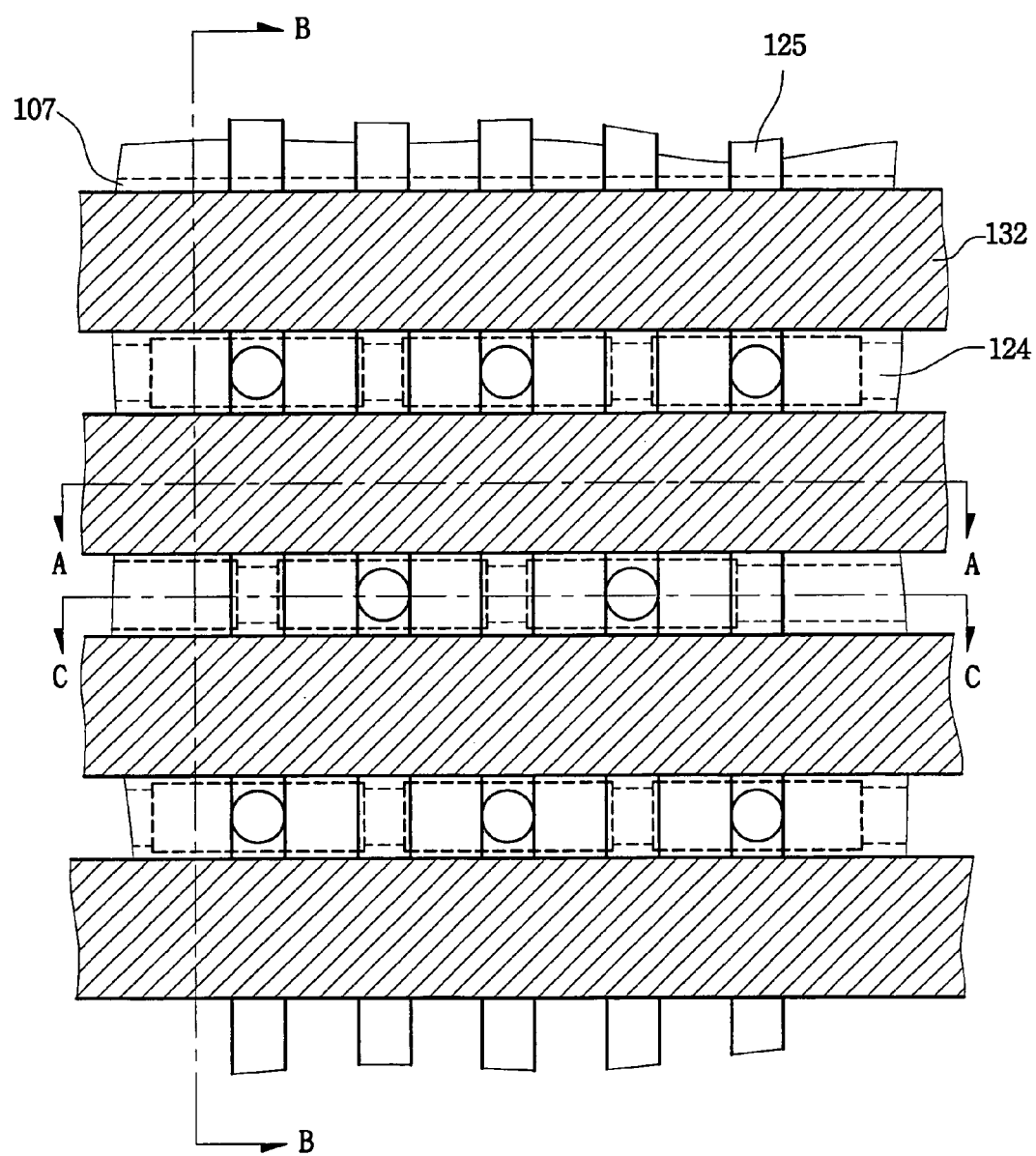
Figure 8B:
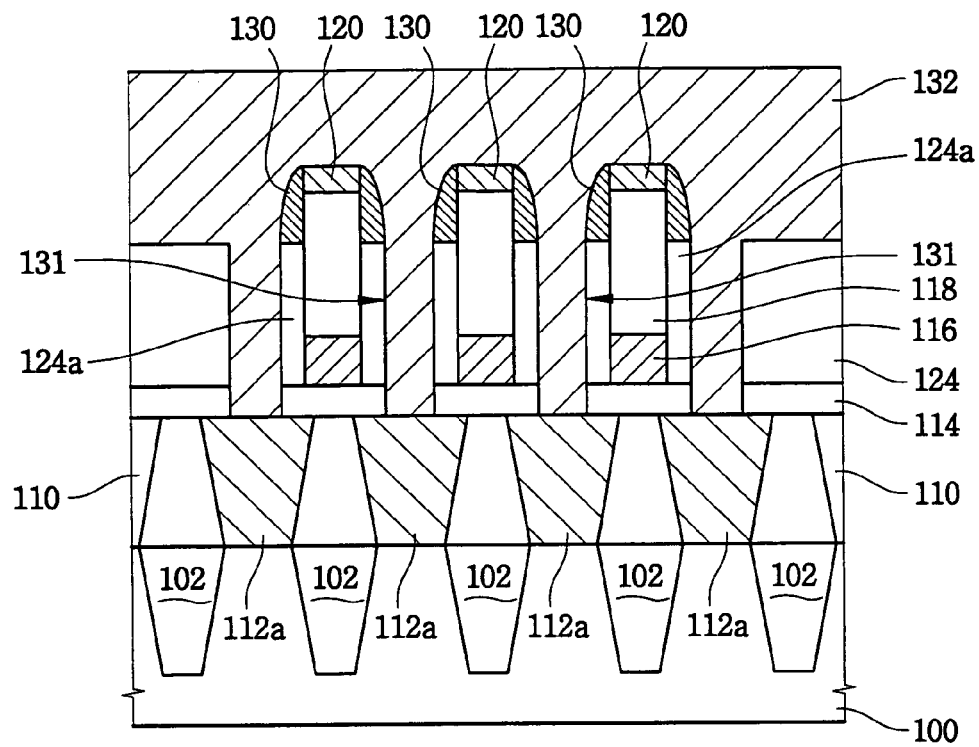
Figure 8C:
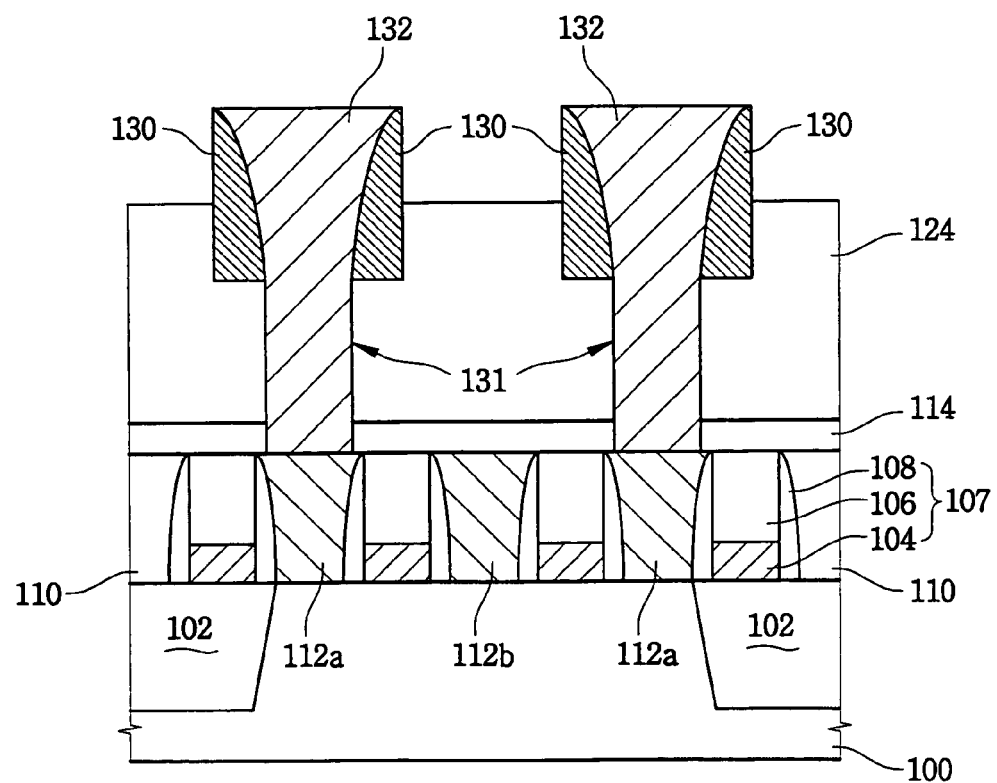
Figure 8D:
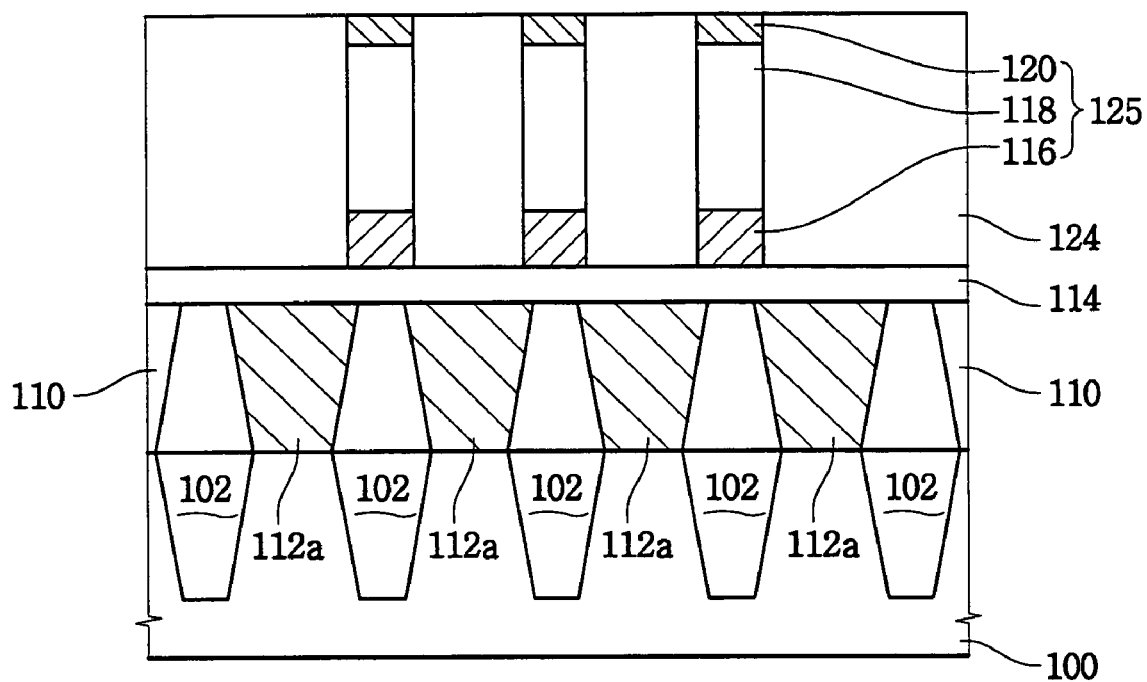

FIG. 8A is a plan diagram of the substrate 100 on which the second conductive layer 132 is protruded, and FIGS. 8B, 8C, and 8D are cross-sectional diagrams taken along lines A–A', B–B', and C–C' in FIG. 8A, respectively.

Referring to FIGS. 8A to 8D, when the sacrificial layer 126 of FIGS. 7C and 7D is etched by a wet etching process, the etching process is stopped at the underlying second insulating layer 124 because the sacrificial layer 126 exposed on the regions where no storage node contact pads are formed has an etching rate faster than that of the underlying second insulating layer 124. Accordingly, the sacrificial layer 126 is removed by the wet etching process, thereby forming a mesa structure where the second conductive layer 132 protrudes. A step of about 1,000 Å occurs between opened regions and covered regions of the sacrificial layer 126 due to the contact patterns 128 (FIG. 5C and FIG. 5D). When the CMP process for the separation of the storage node contact pads into node units is performed, the loss of the bit line mask pattern 118 may occur to expose the underlying first conductive pattern 116. Therefore, since polysilicon is more rapidly recessed than oxide, the sacrificial layer 126 that is positioned on the regions where no storage node contact pads are formed (i.e., the regions covered with the contact patterns 128) is removed to settle a generation of the step.

Figure 9A:
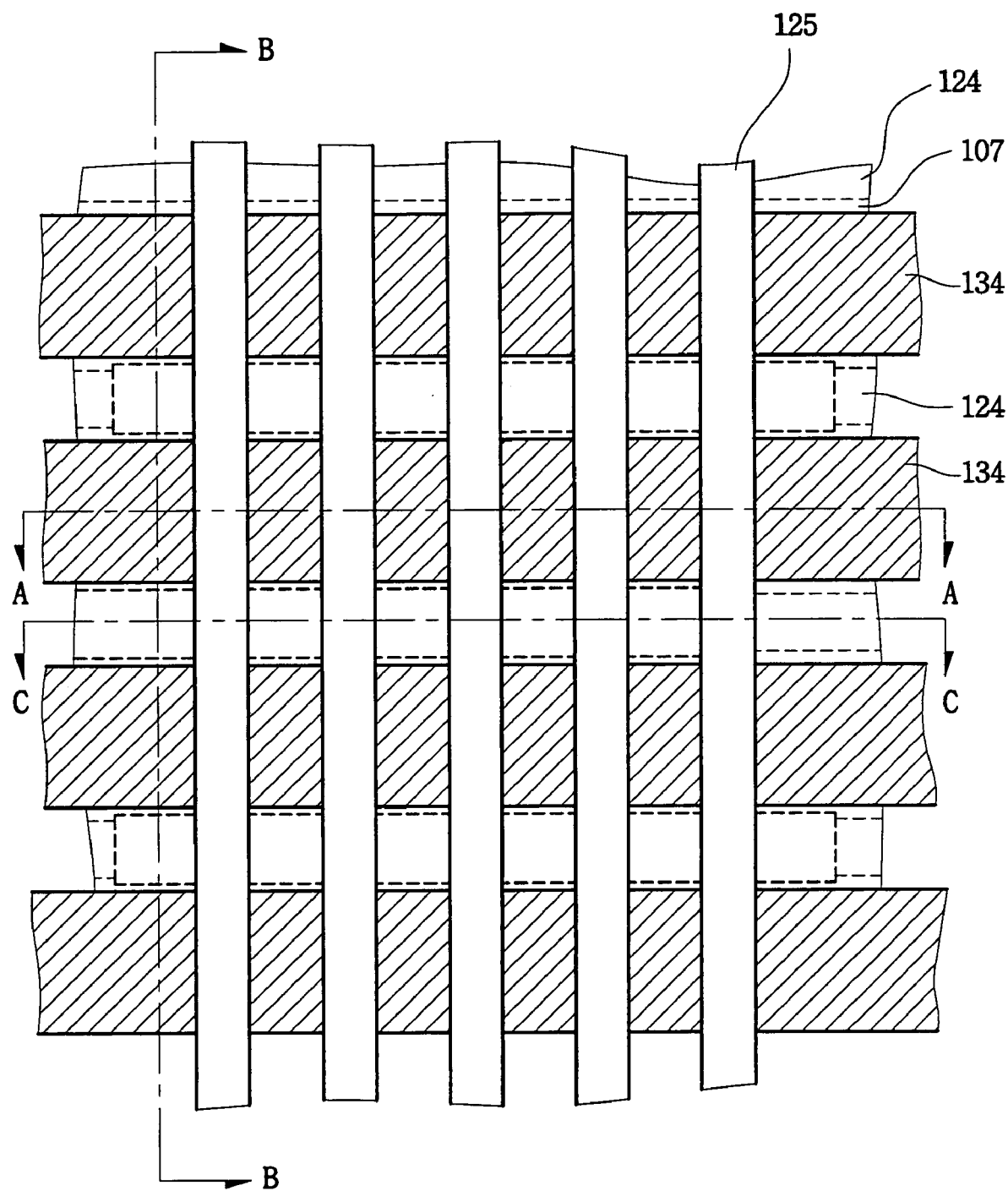
Figure 9B:
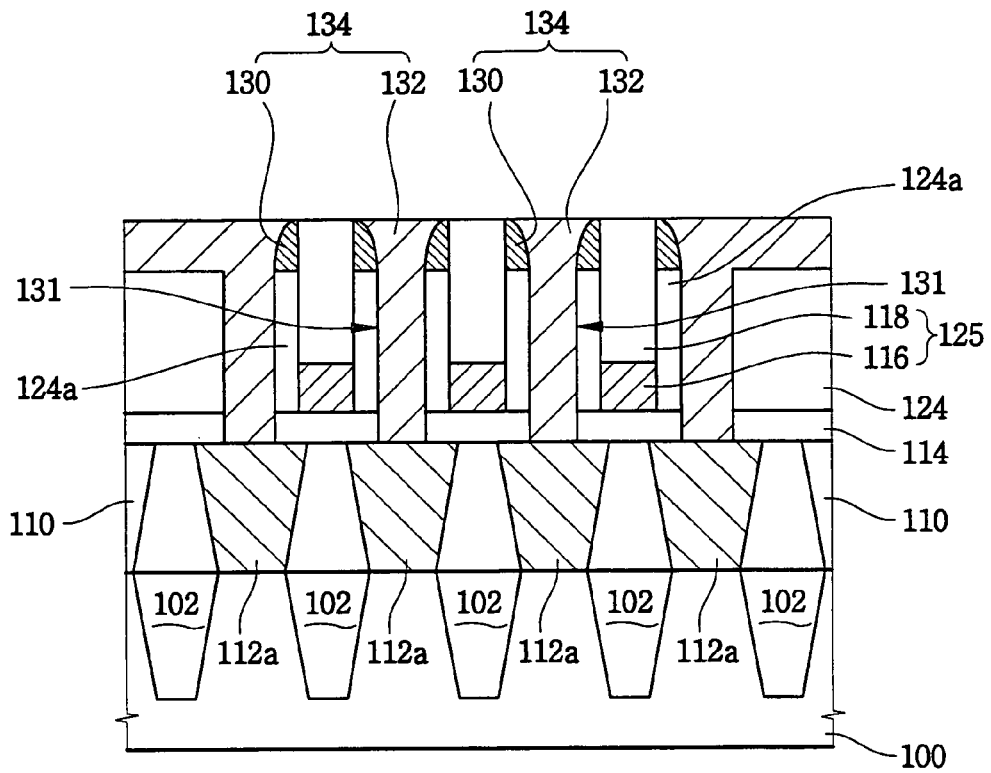
Figure 9C:
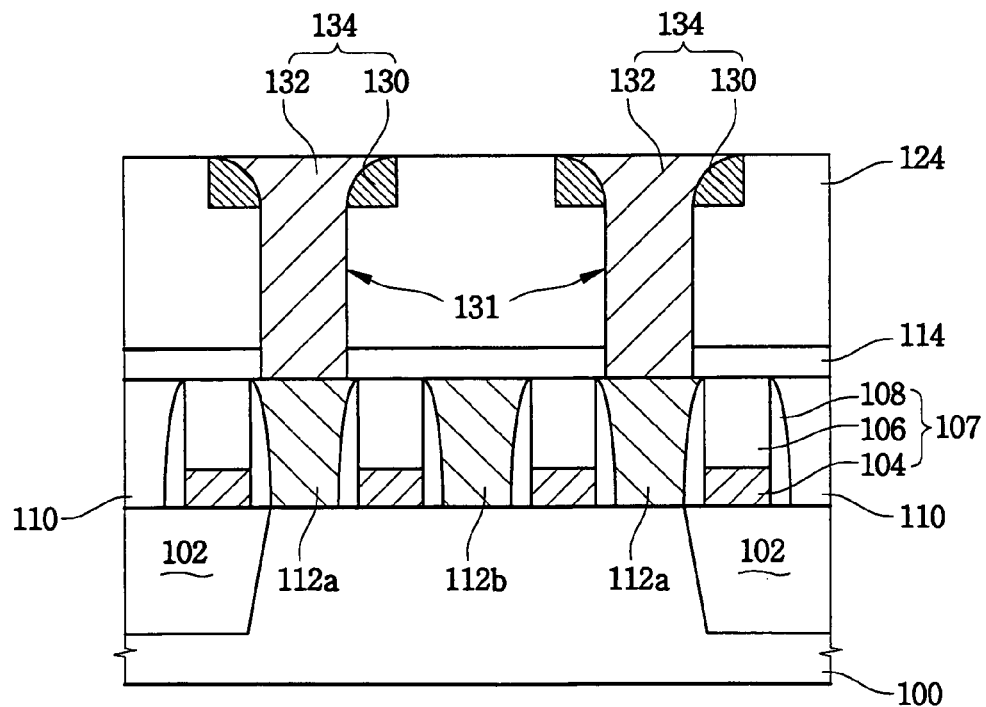
Figure 9D:
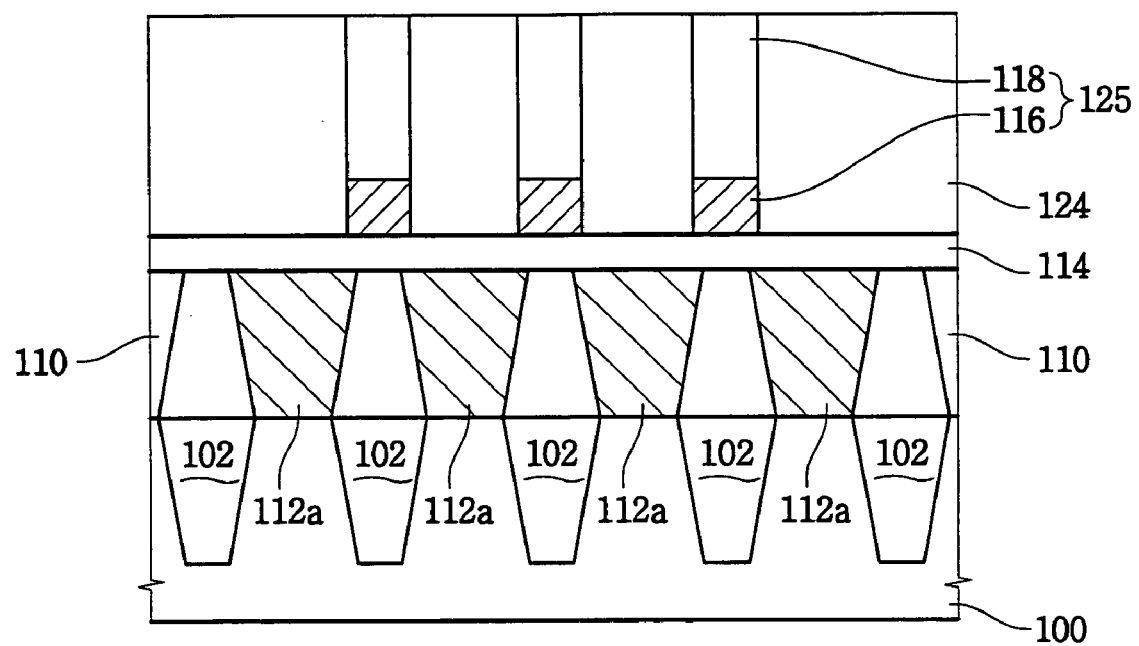

FIG. 9A is a plan diagram of the substrate 100 where the storage node contact pads 134 are formed, and FIGS. 9B, 9C, and 9D are cross-sectional diagrams taken along lines A–A', B–B', and C–C' in FIG. 9A, respectively.

Referring to FIGS. 9A to 9D, after removing the sacrificial layer 126, the second conductive layer 132 is removed by a CMP process, an etch-back process, or a mixed process of a CMP and an etch-back when surfaces of the bit line mask patterns 118 are exposed. Thus, the storage node contact pads 132 separated into node units are formed in the storage node contact holes 131, respectively. At this time, the polysilicon first buffer layer patterns 120 of the bit line 125 are removed with the second conductive layer 132.

In this embodiment, the storage node contact pads 134 have structures having T-shaped cross-sections wherein the second conductive layer 132 and the first spacers 130 because the first spacers 130 on the upper portions of the sidewalls of the bit line 125 is formed using polysilicon.

Thereafter, capacitors (not shown) are formed having storage electrodes, dielectric layers, and plate electrodes.

According to this embodiment, the sacrificial layer 126 is formed on the second insulating layer 124 and then, the second insulating layer 124 is partially etched using the contact patterns 128 having the line shapes. The first spacers 130 composed of polysilicon are formed on the sidewalls of the etched portions of the second insulating layer 124 and the storage node contact holes 131 are formed using the first spacers 130 as etching masks. The storage node contact holes 131 are filled up with the second conductive layer 132.

In the conventional method, the bit line mask layer is thickly formed because only the bit line mask layer protects a surface of a bit line conductive layer during the etching process that forms the storage node contacts. However, in this embodiment, the first and second buffer layer patterns 120 and 122 are formed on the bit line mask patterns 118 and the sacrificial layer 126 protects the first conductive patterns 116 of the bit lines 125 during the etching process for forming the storage node contacts. In addition, without forming bit line spacers, the second insulating layer 124 is directly formed after the bit lines 125 are patterned, thereby remarkably reducing the loss of the bit line mask patterns 118. Therefore, a thickness of the bit line mask pattern 118 is minimized to decrease an aspect ratio of the bit line 125 while the gap-fill margin between adjacent bit lines 125 is improved. When the thickness of the bit line mask pattern 118 decreases, a thickness of the photoresist film for forming the bit line 125 is also reduced, thereby preventing the photoresist film from falling down and lifting the bit line 125.

Additionally, the etching process for forming the storage node contacts 134 is performed after forming the first spacers 130, which results in an increase of a shoulder margin of the bit line 125 relative to the storage node contact hole 131. Hence, an electrical short-circuit between the bit line 125 and the storage node contact pad 134 can be prevented to improve single bit failures.

Furthermore, the parasitic capacitance, i.e., the bit line loading capacitance, between the bit line 125 and the storage node contact pad 134 or the bit line 125 and an adjacent bit line 125, can be reduced by an amount of about 25~30% because the second spacers 124a composed of the second insulating layer (i.e., oxide having a low dielectric constant) are formed on the lower sidewalls of the bit lines 125. When the bit line loading capacitance decreases, the number of cells per unit bit line increases, improving cell efficiency and also increasing the number of usable chips per wafer.

FIGS. 10A–10B, 11A–11B, 12A–12B, 13A–13B, 14A–14B, and 15A–15B are cross-sectional diagrams illustrating a method of manufacturing a DRAM device according to another embodiment of the present invention. FIGS. 10A, 11A, 12A, 13A, 14A, and 15A are cross-sectional diagrams in a bit line direction of the DRAM device while FIGS. 10B, 11B, 12B, 13B, 14B, and 15B are cross-sectional diagrams in a word line direction of the DRAM device.

Figure 10A:
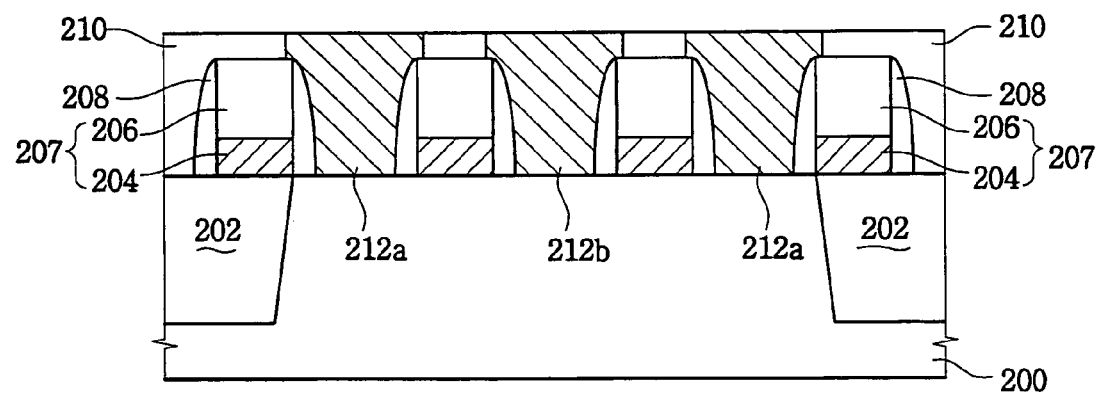
FIGS. 10A–10B, 11A–11B, 12A–12B, 13A–13B, 14A–14B, and 15A–15B are cross-sectional diagrams illustrating a method of manufacturing a DRAM device in accordance with another embodiment of the invention.
Figure 10B:
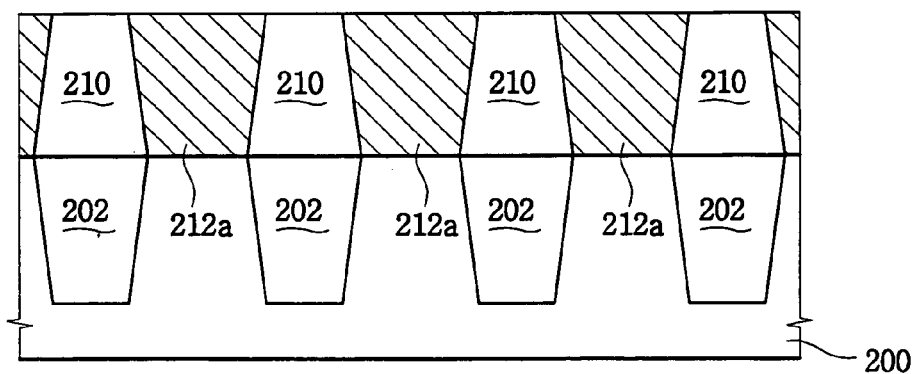

FIGS. 10A and 10B show steps of forming word lines 207 and SAC pads 212a and 212b on a semiconductor substrate 200.

Referring to FIGS. 10A and 10B, isolation regions 202 are formed on the semiconductor substrate 200 by an isolation process like a shallow trench isolation (STI) process or a local oxidation of silicon (LOCOS) process so that active regions are defined on the semiconductor substrate 200.

After growing a thin gate oxide layer (not shown) in the active regions of the substrate 200 by a thermal oxidation process, a gate conductive layer and a gate mask layer are sequentially formed on the gate oxide layer. Preferably, the gate conductive layer has a polycide structure including a doped polysilicon film and a metal silicide film formed on the doped polysilicon film. The gate mask layer is formed using a material having an etching selectivity relative to an interlayer dielectric layer successively formed by a subsequent process. The gate mask layer is preferably formed using a nitride based material.

The gate mask layer and the gate conductive layer are patterned by a photolithographic process to form the word lines 207 on the semiconductor substrate 200. Each of the word lines 207 includes a gate conductive pattern 204 and a gate mask pattern 206.

An insulating layer is formed on an entire surface of the substrate 200 where the word lines 207 are positioned. The insulating layer is formed using a material having an etching selectivity relative to the interlayer insulating layer successively formed. Preferably, the insulating layer is formed using a nitride based material.

The insulating layer is anisotropically etched to form gate spacers 208 on sidewalls of the word lines 207, respectively.

Source/drain regions (not shown) of MOS transistors are formed at portions of the active regions exposed between the word lines 207. As a result, the MOS transistors are formed on the semiconductor substrate 200. Alternatively, before forming the gate spacers 208, an LDD ion implantation process may be carried out to form lightly doped source/drain regions at the portions of the active regions between the word lines 207, thereby forming source/drain regions having LDD structures. Some source/drain regions correspond to capacitor contact regions connected to storage electrodes of capacitors while other source/drain regions correspond to bit-line contact regions connected to bit lines.

The interlayer dielectric layer 210 is formed on the semiconductor substrate 200 having the MOS transistor formed thereon. The interlayer dielectric layer 210 is formed using an oxide based material.

The interlayer dielectric layer 210 is planarized by a CMP process, an etch-back process or a mixed process of a CMP and an etch-back. The interlayer dielectric layer 210 is anisotropically etched using an etching gas having a high etching selectivity relative to the gate mask pattern 208 composed of nitride. Accordingly, contact holes exposing the source/drain regions are formed through the interlayer dielectric layer 210. The contact holes are self-aligned relative to the word lines 208, respectively.

After forming a polysilicon layer doped with impurity by a high concentration to fill up the contact holes, the polysilicon layer is planarized by a CMP process, an etch-back process or a mixed process of a CMP and an etch-back. As a result, the SAC pads 212a and 212b separated into node units are formed in the contact holes, respectively. The SAC pads 212a and 212b are planarized when the interlayer dielectric layer 210 is exposed. Alternatively, the SAC pads 212a and 212b are planarized when the gate mask patterns 208 are exposed as described above.

In this embodiment, some SAC pads 212a connected to the source regions correspond to capacitor contact pads while other SAC pads 212b connected to the drain regions correspond to bit line contact pads.

Figure 11A:
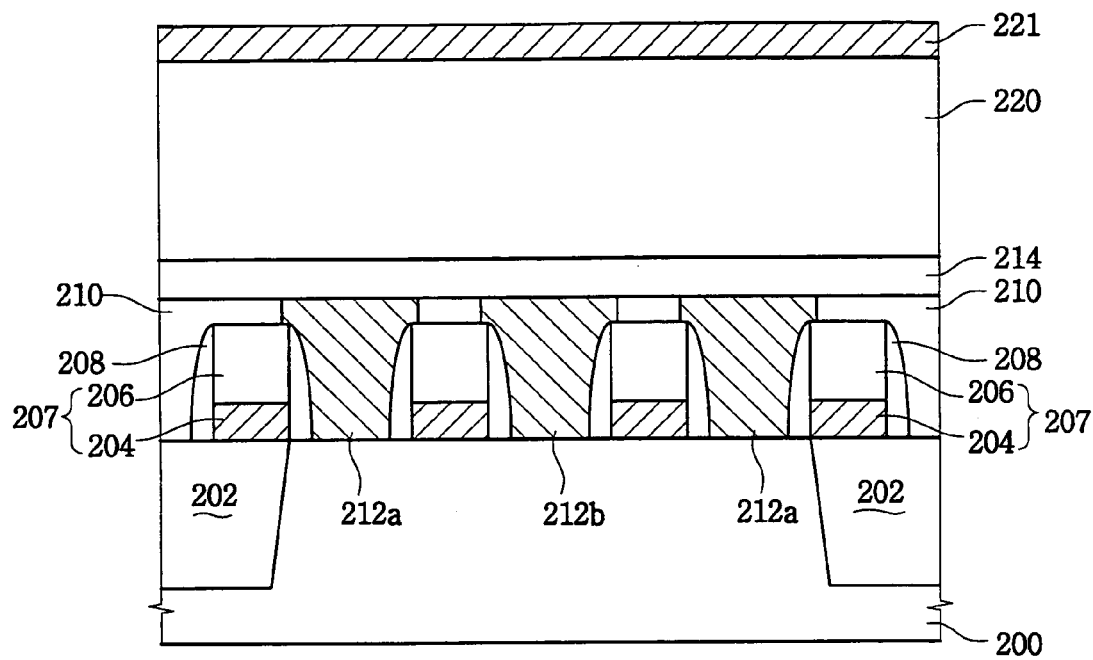
Figure 11B:
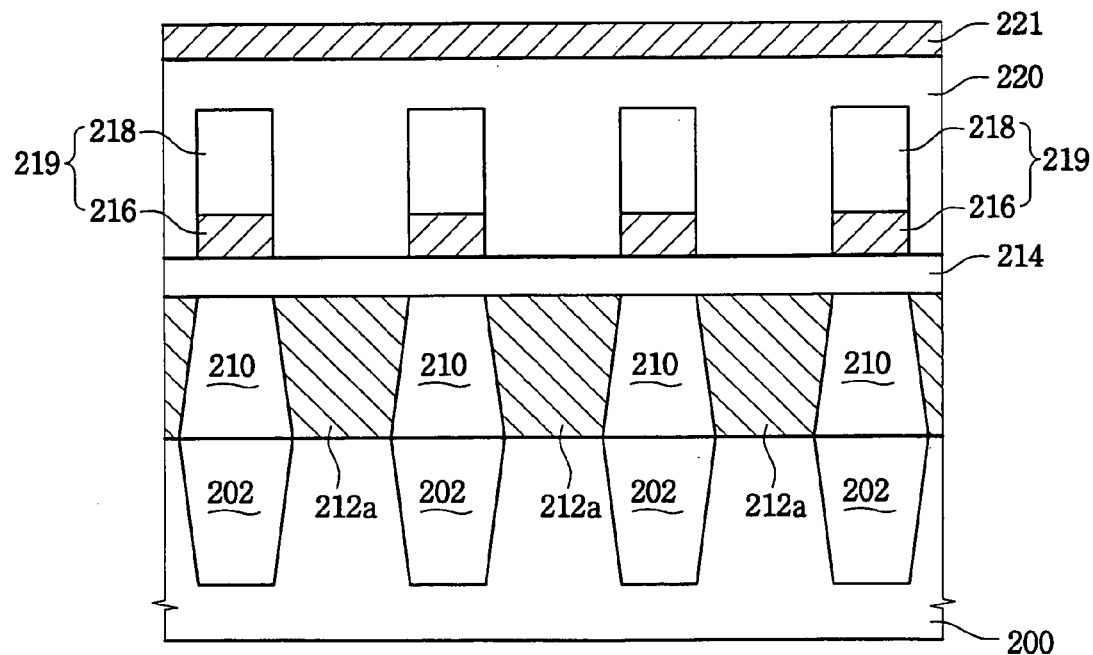

FIGS. 11A and 11B show steps of successively forming a first insulating layer 214, bit lines 219, a second insulating layer 220 and a contact mask layer 221 on the interlayer dielectric layer 210.

Referring to FIGS. 11A and 11B, after forming the SAC pads 212a and 212b, an oxide based material such as BPSG, USG, HDP oxide, CVD oxide, etc., is deposited to have a thickness of about 1,000~3,000 Å on an entire surface of the resultant structure. Preferably, the oxide based material has a thickness of about 2,000 Å. Thus, the first insulating layer 214 is formed on the interlayer dielectric layer 210 and on the SAC pads 212a and 212b.

To ensure a margin of a successive photo process, a surface of the first insulating layer 214 is planarized by a CMP process, an etch-back process or a mixed process of a CMP and an etch-back. Here, the planarization of the first insulating layer 214 should be carried out so that the first insulating layer 214 remains to have a thickness of about 1,000~2,000 Å on the resultant structure. The first insulating layer 214 serves as an interlayer dielectric layer for isolating the SAC pads 212a and 212b from the bit lines 219 successively formed thereon.

The first insulating layer 214 is etched by a photolithographic process to form bit line contact holes (not shown) exposing the SAC pads 212b on the drain regions.

A first conductive layer and a bit line mask layer are sequentially formed on the first insulating layer 214. Preferably, the first conductive layer includes a composite layer having a first film composed of a first metal and/or a composition of the first metal, e.g., titanium (Ti)/titanium nitride (TiN), and a second film composed of a second metal, e.g., tungsten (W). The bit line mask layer protects the underlying first conductive layer during a successive etching process for forming storage node contact holes. The bit line mask layer is formed using a material having an etching selectivity relative to the second insulating layer 220 successively formed. Preferably, the bit line mask layer is formed using a nitride.

The bit line mask layer and the first conductive layer are patterned by a photolithographic process to form the bit lines 219 perpendicular to the word lines 207. Each of the bit lines 219 includes a bit line conductive pattern 216 and a bit line mask pattern 218. The bit line conductive patterns 216 correspond to first conductive patterns, respectively.

In this embodiment, the bit line conductive pattern 216 having the two films is directly contacted with the bit line contact holes. Alternatively, as described above, bit line contact pads having a barrier metal film like Ti/TiN and a third metal film such as W are formed in the bit line contact holes. Then, a bit line conductive pattern 216 including one film of W is formed and directly contacted with the bit line contact pad.

An oxide based material, preferably HDP oxide, is deposited on the bit lines 219 and on the first insulating layer 214 to form the second insulating layer 220. A predetermined portion of the second insulating layer 224 is planarized by a CMP process, an etch-back process, or a mixed process of a CMP and an etch-back. Here, to prevent voids from forming in the second insulating layer 224 between adjacent bit lines 219, a nitride layer may be formed on the bit lines 219 and on the first insulating layer 214 before forming the second insulating layer 220. Preferably, the nitride layer has a thickness of about 50~200 Å.

Thereafter, a material, preferably polysilicon, is deposited on the second insulating layer 220 to form the contact mask layer 221. The material has an etching selectivity relative to the second insulating layer 220 and has an etching rate substantially similar to that of the second conductive layer for storage node contact pads that is successively deposited.

Figure 12A:
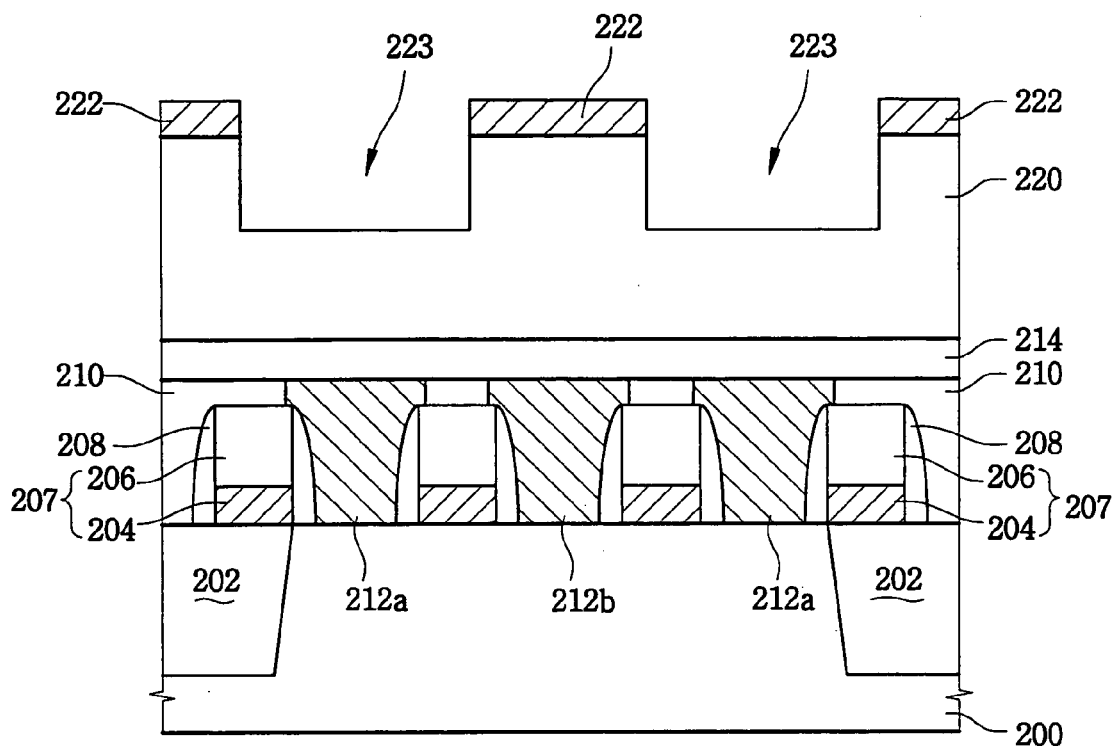
Figure 12B:
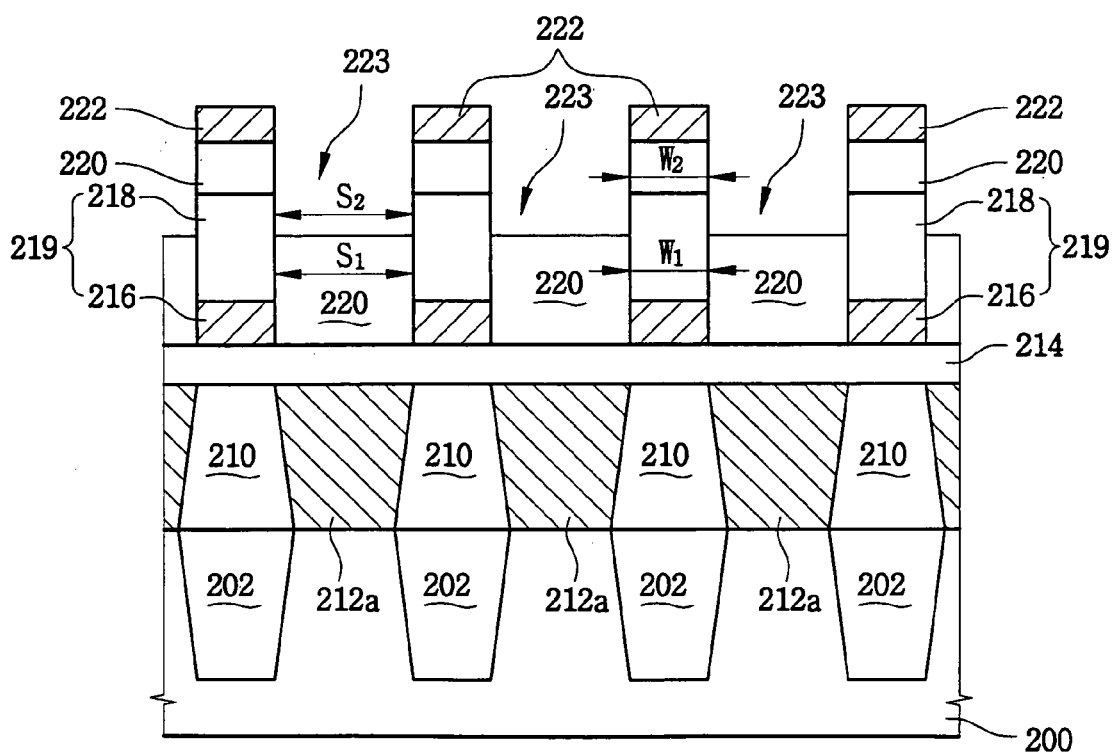

FIGS. 12A and 12B show a step of forming contact patterns 222 on the second insulating layer 220.

Referring to FIGS. 12A and 12B, the contact mask layer 221 is patterned by a photolithographic process to form storage node contact patterns 222 that open regions where storage node contact holes will be formed. Preferably, the contact patterns 222 have contact shapes that open the regions for the storage node contact hole regions, respectively.

Predetermined portions of the second insulating layer 220 are partially etched over the bit line conductive patterns 216 by a time-etching process using the contact patterns 222 as etching masks. Preferably, the etching process is stopped at a portion of the second insulating layer 220 having a thickness of more than about 500 Å from the surface of the bit line conductive patterns 216 composed of tungsten (W). Here, the partial etching process is performed so that a width (S2) of the etched portion 223 of the second insulating layer 220 is smaller than or similar to an interval (S1) between the adjacent bit lines 219. That is, a width (W2) of a portion of the second insulating layer 220 on the bit line 219 is larger than or similar to a width (W1) of the bit line 219.

Figure 13A:
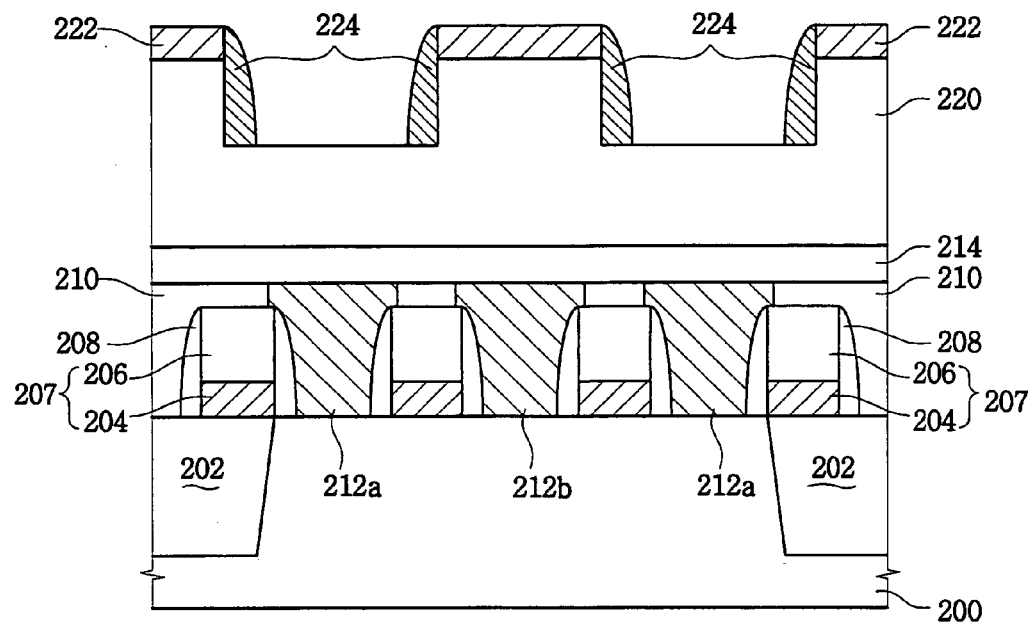
Figure 13B:
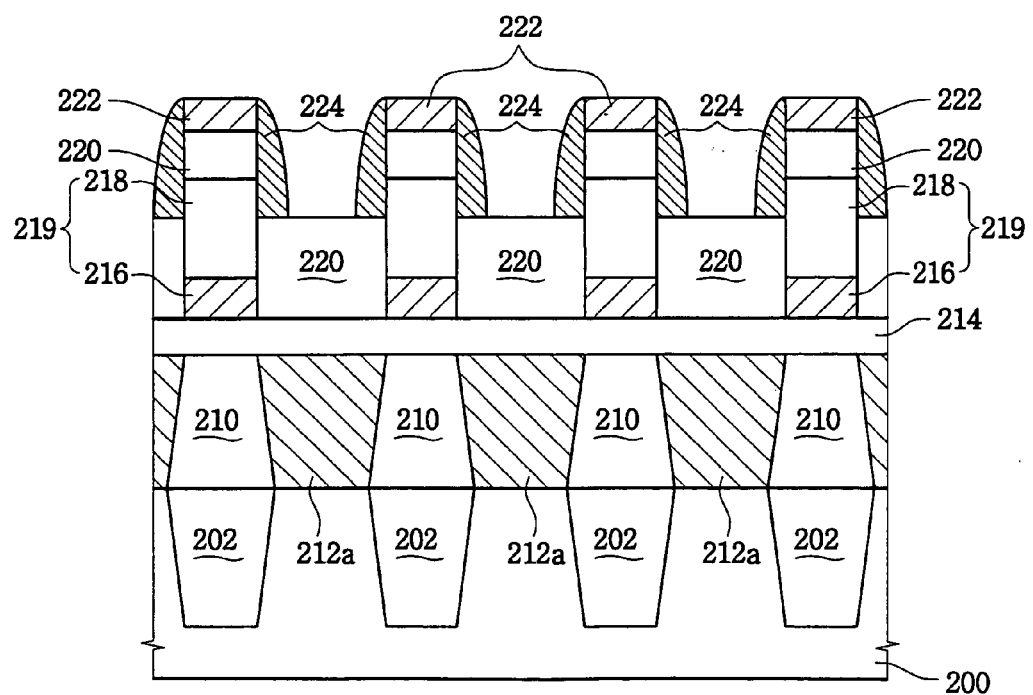

FIGS. 13A and 13B show a step of forming first spacers 224 on sidewalls of the etched portions of the second insulating layer 220.

Referring to FIGS. 13A and 13B, a material having an etching selectivity relative to the second insulating layer 220 and having an etching rate substantially similar to that of the second conductive layer for the storage node contact pads, preferably polysilicon, is deposited on an entire surface of the resultant structure including the partially etched portions of the second insulating layer 220. The material has a thickness of about 200~600 Å and is anisotropically etched to form the first spacers 224 on the sidewalls of the etched portions of the second insulating layer 220. Particularly, the first polysilicon spacers 224 are formed on upper portions of the sidewalls of the bit lines 219 from portions of the bit line mask patterns 218 to the contact patterns 222.

Since the first polysilicon spacers 224 have a high etching selectivity relative to nitride as well as oxide, a loss of the bit line mask pattern 218 can be prevented and a shoulder margin can be sufficiently ensured during a successive etching process for forming storage node contacts.

Figure 14A:
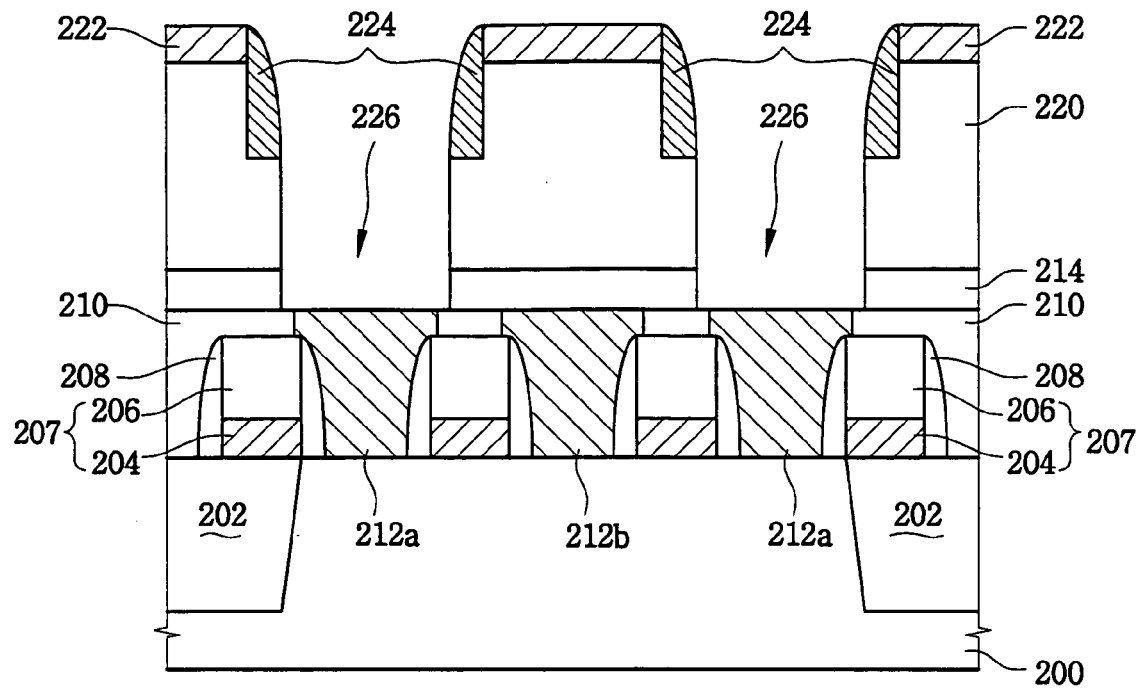
Figure 14B:
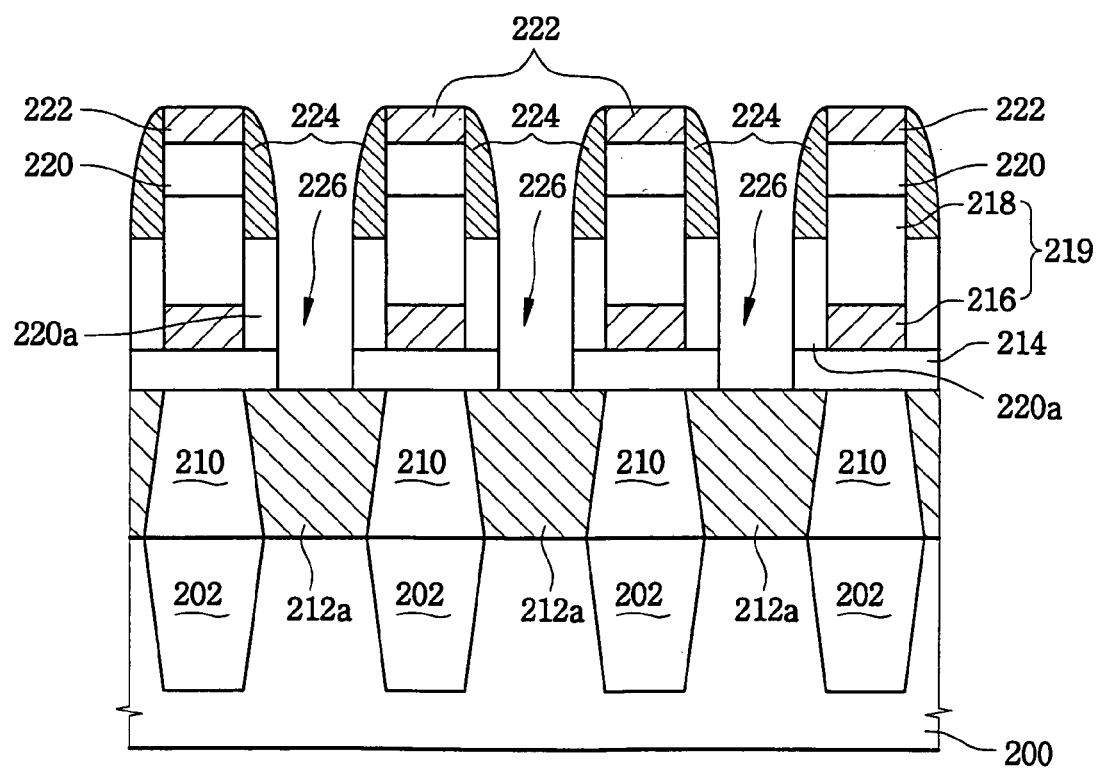

FIGS. 14A and 14B show a step of forming storage node contact holes 226 exposing the SAC pads 212a.

Referring to FIGS. 14A and 14B, the second and first insulating layers 220 and 214 composed of oxides are dry etched using the first spacers 224 composed of polysilicon as etching masks, thereby forming the storage node contact holes 226 exposing the capacitor contact pads, i.e., the SAC pads 212a positioned on the source regions. Here, second spacers 220a composed of portions of the second insulating layer 220 are formed on the sidewalls of the bit lines 219 beneath the first spacers 224, respectively. That is, the first polysilicon spacers 224 are formed at upper portions of the sidewalls of the bit lines 219 and the second oxide spacers 220a are formed at lower portions of the sidewalls of the bit lines 219.

Figure 15A:
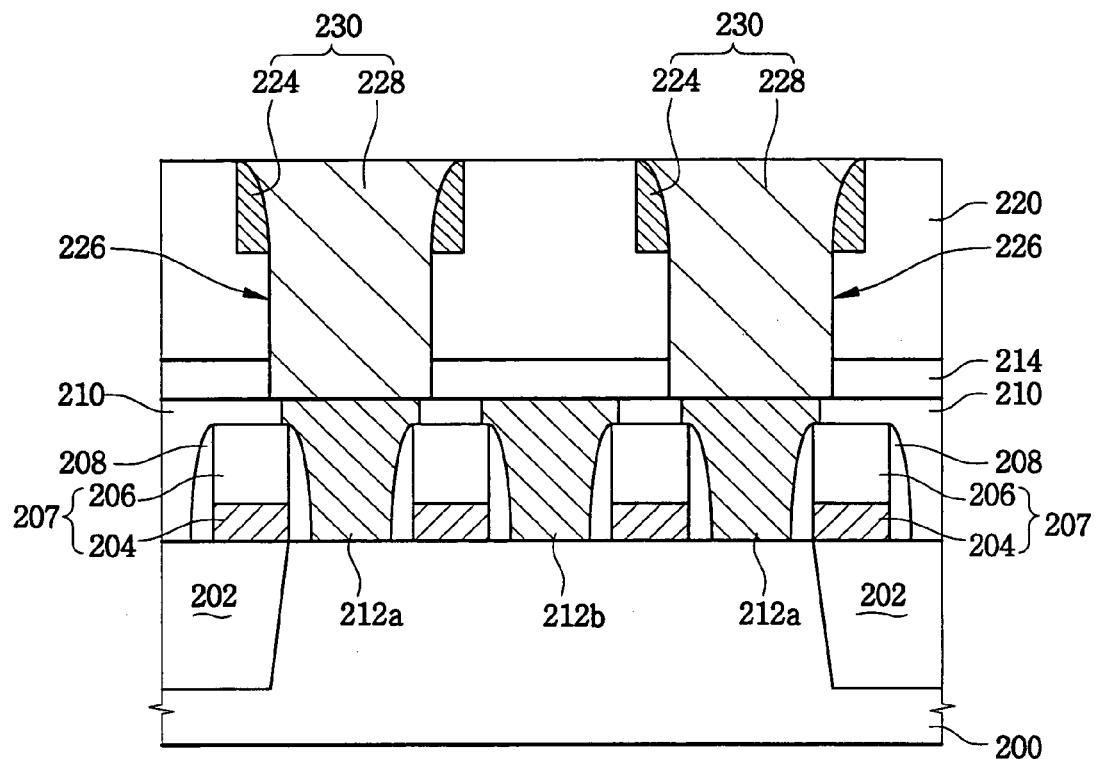
Figure 15B:
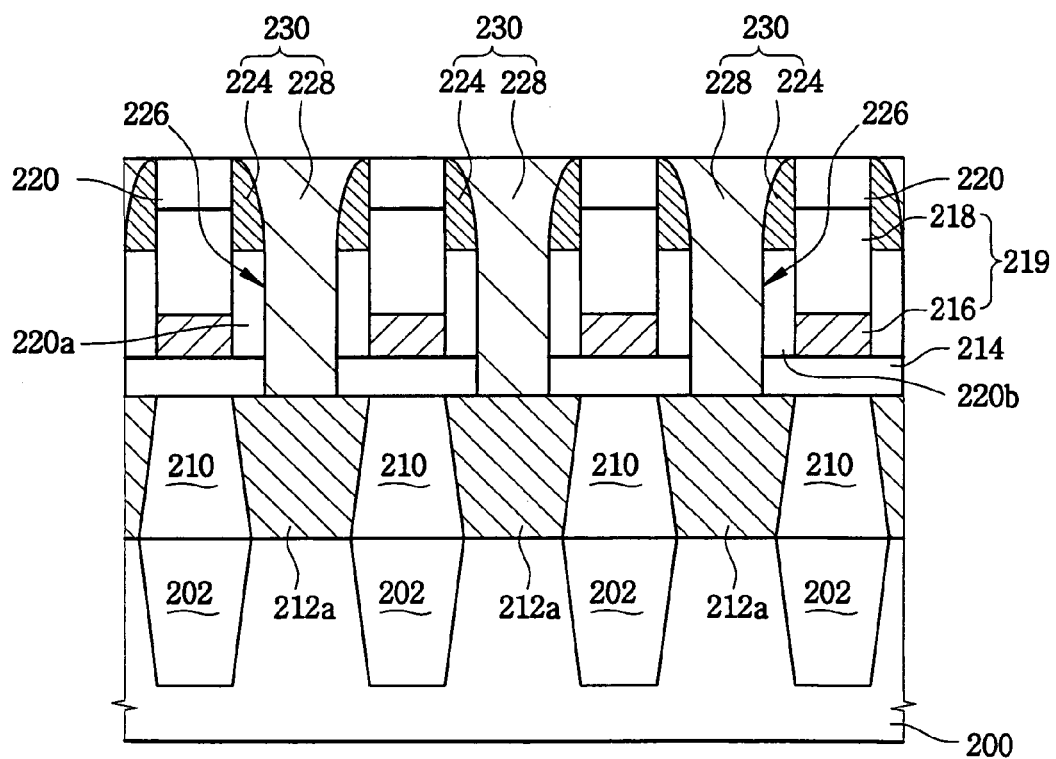

FIGS. 15A and 15B show a step of forming storage node contact pads 230 in the storage node contact holes 226.

Referring to FIGS. 15A and 15B, after forming the storage node contact holes 226, a cleaning process is carried out to remove native oxide layers grown on the SAC pads 212a exposed through the storage node contact holes 226, polymers, various particles, etc.

The second conductive layer 228 is formed on an entire surface of the resultant structure using polysilicon, thereby filling up the storage node contact holes 226. The second conductive layer 228 is etched by a planarization process such as a CMP process, an etch-back process, or a mixed process of a CMP and an etch-back when a surface of the second insulating layer 220 on the bit lines 219 is exposed. Thus, storage node contact pads 230 separated into node units are formed in the storage node contact holes 226.

In this embodiment, the storage node contact pads 230 have T-shaped sectional structures including the second conductive layer 228 and the first spacers 224 because the first polysilicon spacers 224 are formed at the upper portions of the sidewalls of the bit lines 219.

Thereafter, capacitors (not shown) having storage electrodes, dielectric layers, and plate electrodes are formed on the resultant structure by using general processes for forming the capacitors.

The method of this embodiment is substantially similar to that of others, except in forming the storage node contact patterns 222 having the contact shapes. That is, since the predetermined portion of the second insulating layer 220 is planarized over the bit line 219, the loss of the bit line mask pattern 218 can be reduced due to the second insulating layer 220 on the bit line 219 during the etching process for forming the storage node contacts.

Additionally, the shoulder margin of the bit line 219 relative to the storage node contact hole 226 can be increased because the first spacers 224 are formed at the upper portions of the sidewalls of the bit line mask patterns 218, thereby preventing electrical short-circuits between the bit lines 219 and the storage node contact pads 230.

Furthermore, because the second spacers 220a composed of the oxide having a low dielectric constant are formed at the lower portions of the sidewalls of the bit lines 219, the bit line loading capacitance is effectively reduced.

FIGS. 16A to 16F are cross-sectional diagrams illustrating a method of manufacturing a DRAM device in accordance with still another embodiment of the invention.

Figure 16A:
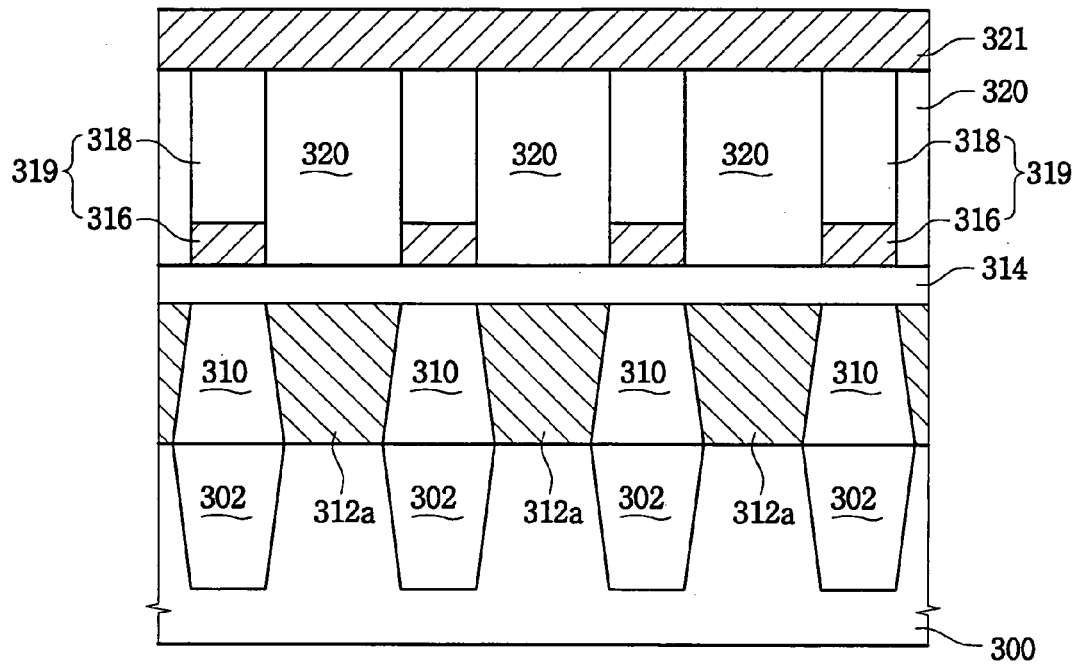
FIGS. 16A–16F are cross-sectional diagrams illustrating a method of manufacturing a DRAM device in accordance with still another embodiment of the invention.

FIG. 16A shows steps of successively forming a first insulating layer 314, bit lines 319, a second insulating layer 320, and a contact mask layer 321 on a semiconductor substrate 300.

Referring to FIG. 16A, with processes substantially similar to those illustrated in FIGS. 3A–3C and 10A–10B, isolation regions 302, MOS transistors, an interlayer dielectric layer 310, and SAC pads 312a are sequentially formed on the semiconductor substrate 300.

An oxide based material is deposited on the interlayer insulating layer 310 and on the SAC pads 312a so that the first insulating layer 314 is formed on the interlayer dielectric layer 310 and on the SAC pads 312a.

To ensure a process margin of a successive photo process, a surface of the first insulating layer 314 is planarized by a CMP process, an etch-back process, or a mixed process of a CMP and an etch-back. The first insulating layer 314 serves as an interlayer dielectric layer for isolating the SAC pads 312a from the bit lines 319 successively formed thereon.

Bit line contact holes (not shown) and the bit lines 319 are successively formed by processes substantially similar to those of the embodiments discussed above. In particular, each of the bit lines 319 includes a bit line conductive pattern 316 and a bit line mask pattern 318. The bit line conductive pattern 316 corresponding to a first conductive pattern includes a first film of titanium (Ti)/titanium nitride (TiN) and a second film of tungsten (W). The bit line mask pattern 318 is composed of nitride. Alternatively, bit line contact pads having a barrier metal film of Ti/TiN and a third metal film of W are formed in the bit line contact holes. Then, a bit line conductive pattern 316 including single film of W is formed and directly contacted with the bit line contact pad.

An oxide based material, preferably HDP oxide, is deposited on the bit lines 319 and on the first insulating layer 314 to form the second insulating layer 320. The second insulating layer 320 is planarized by a CMP process, an etch-back process, or a mixed process of a CMP and an etch-back when surfaces of the bit lines 319 are exposed.

A material having an etching selectivity relative to the second insulating layer 320, preferably polysilicon or titanium nitride (TiN), is deposited on the bit lines 319 and on the second insulating layer 320 so that the contact mask layer 321 is formed on the bit lines 319 and on the second insulating layer 320.

Figure 16B:
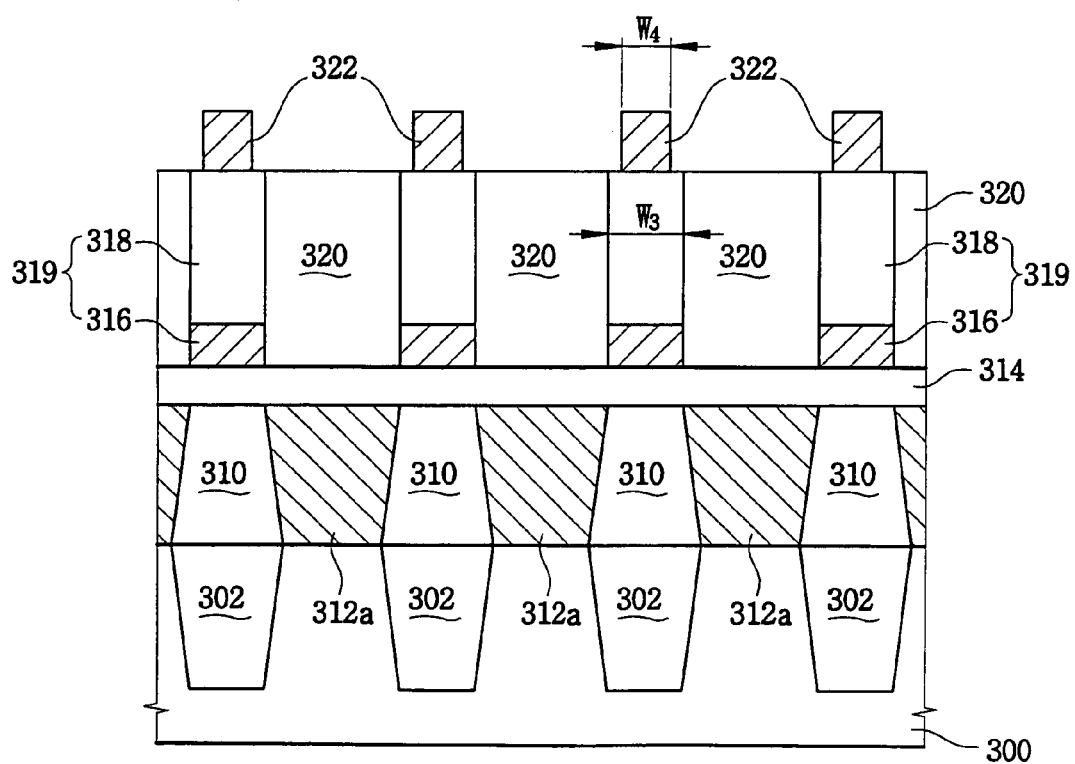

FIG. 16B shows a step of forming contact patterns 322 on the bit lines 319.

Referring to FIG. 16B, the contact mask layer 321 is patterned by a photolithographic process to form storage node contact patterns 322 that open portions of the second insulating layer 320 where storage node contact holes will be formed. Preferably, the contact patterns 322 are formed to have line shapes such that a plurality of storage node contact holes adjacent to one another in a direction perpendicular to the bit lines 319, i.e., in a word line direction, are merged and opened. In addition, it is preferable that the contact pattern 322 has a width (W4) smaller than a width (W3) of the bit line 319. Because the bit line mask pattern 318 of nitride has a high etching selectivity relative to the polysilicon contact mask layer 321, a loss of the bit line mask pattern 318 is adjusted below about 100 Å during the etching process of forming the contact patterns 322.

Figure 16C:
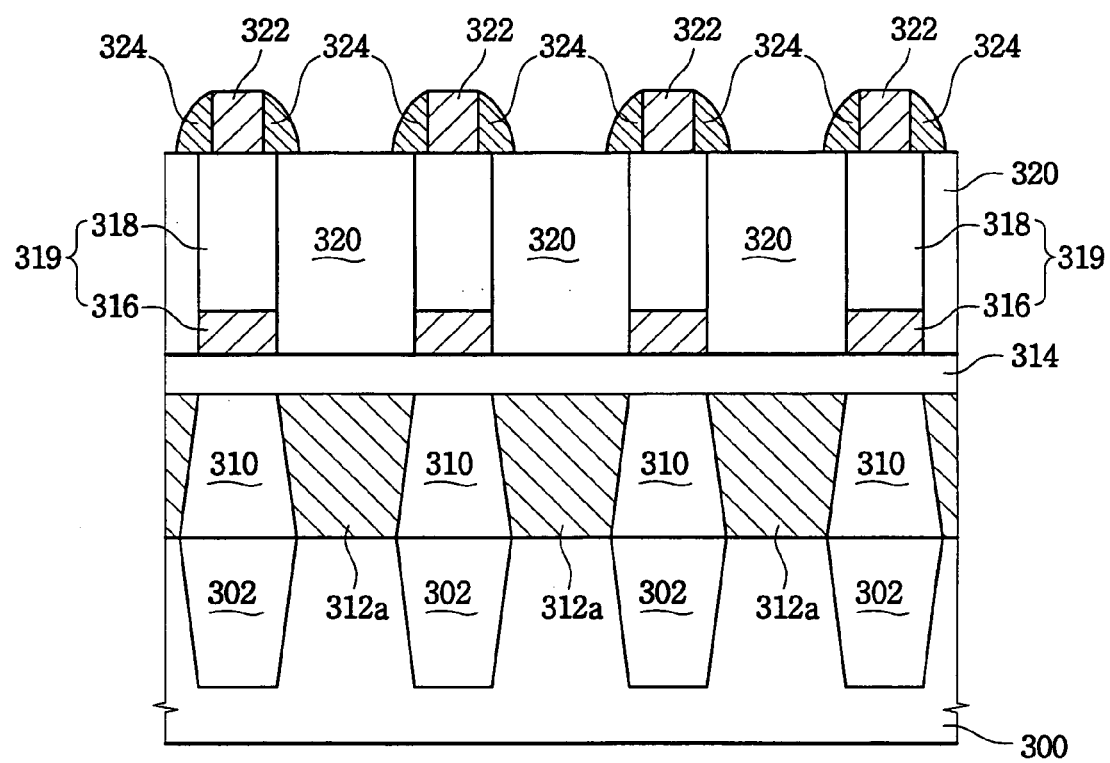

FIG. 16C shows a step of forming first spacers 324 on the bit lines 319.

Referring to FIG. 16C, a material having an etching selectivity relative to the second insulating layer 320 (e.g., polysilicon, nitride, tungsten or titanium nitride) is deposited on the contact patterns 322 and on the second insulating layer 320 to have a thickness of several hundred Å. The material is anisotropically etched to form the first spacers 324 on sidewalls of the contact patterns 322, respectively. Preferably, the first spacers 324 are composed of polysilicon.

Figure 16D:
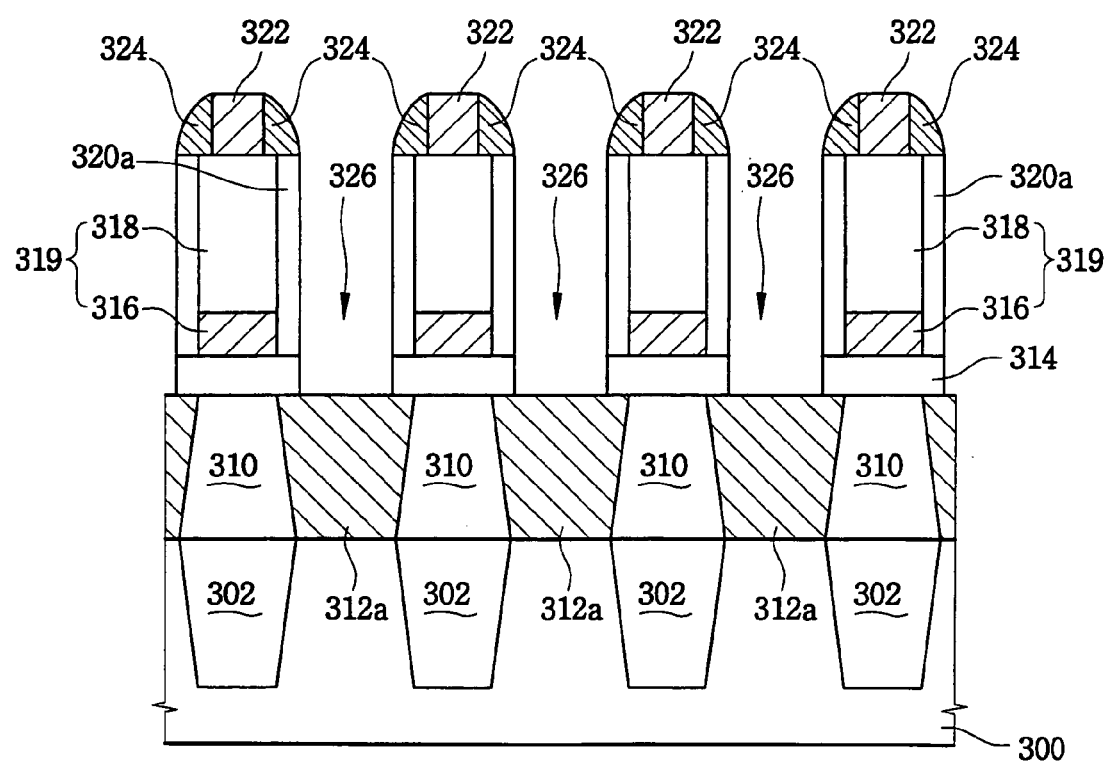

FIG. 16D shows a step of forming storage node contact holes 326 exposing the SAC pads 312a.

Referring to FIG. 16D, the second and first insulating oxide layers 320 and 314 are dry etched using the first spacers 324 as etching masks to form the storage node contact holes 326 exposing capacitor contact regions, i.e., the SAC pads 312a positioned on source regions. Here, second spacers 320a composed of portions of the second insulating layer 320 are formed on sidewalls of the bit lines 319.

Figure 16E:
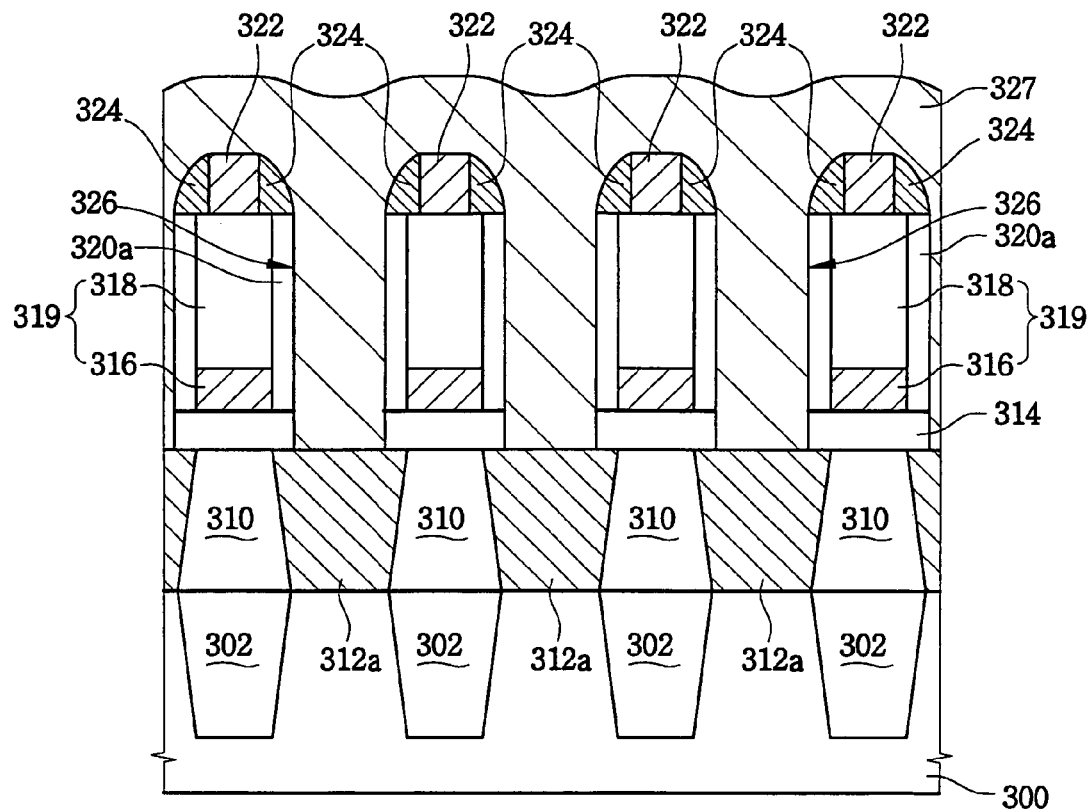

FIG. 16E shows a step of forming a second conductive layer 327 on the resultant structure.

Referring to FIG. 16E, after forming the storage node contact holes 326, a cleaning process is carried out to remove native oxide layers grown on the SAC pads 312a exposed through the storage node contact holes 326 such as polymers, various particles, etc.

The second conductive layer 327 is formed on an entire surface of the resultant structure using polysilicon so that the storage node contact holes 326 are filled with the second conductive layer 327.

Figure 16F:
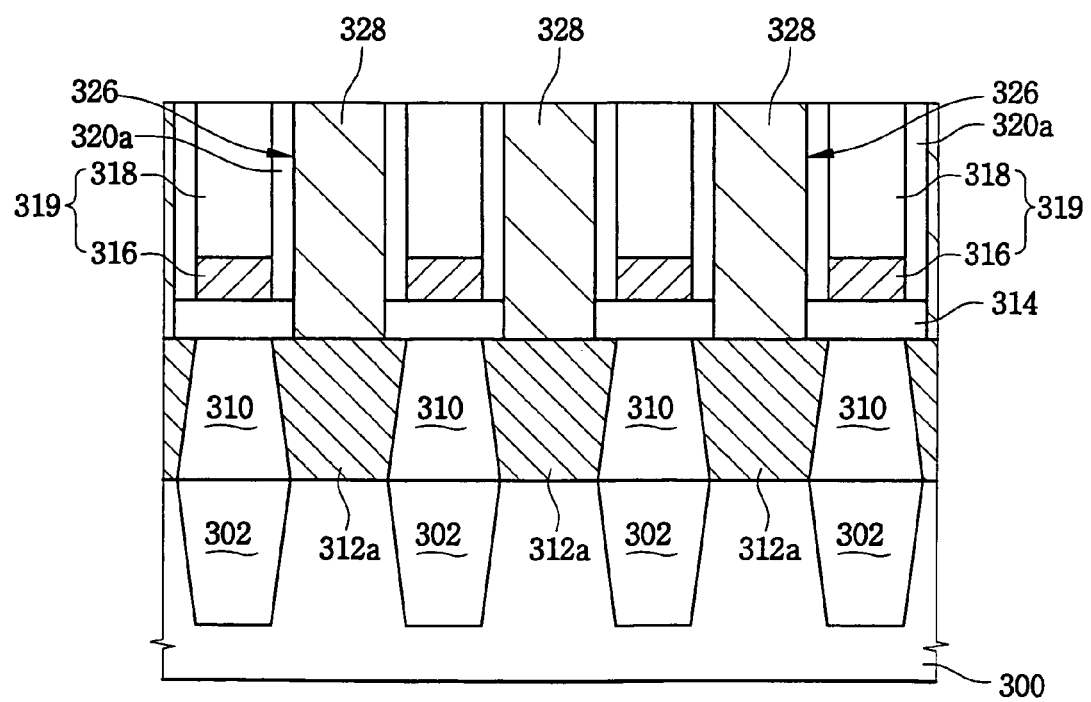

FIG. 16F shows a step of forming storage node contact pads 328 in the storage node contact holes 326.

Referring to FIG. 16F, the second conductive layer 327 is partially removed by a spin process using chemicals, a wet etch-back process, a dry etch-back process, a CMP process, or a mixed process using combinations of these processes when surfaces of the bit line mask patterns 318 are exposed. Thus, storage node contact pads 328 separated into node units are formed in the storage node contact holes 326, respectively.

Thereafter, capacitors (not shown) having storage electrodes, dielectric layers, and plate electrodes are formed using conventional processes.

According to this embodiment, the contact patterns 322 and the first spacers 324 composed of the material having the etching selectivity relative to oxide, are formed over the bit lines 319. Using the contact patterns 322 and the first spacers 324 as etching masks, the second and first oxide insulating layers 320 and 314 are etched to form the storage node contact holes 326. During the etching process for forming the storage node contact 328, a loss of the bit line mask pattern 318 is reduced due to the contact patterns 322 and the first spacers 324. Hence, a thickness of the bit line mask pattern 318 is minimized to decrease a height of the bit line 319.

Additionally, since the storage node contact holes 326 are not formed by the conventional SAC method, a shoulder margin of the bit line 319 increases to prevent a single bit failure caused by an electrical short-circuit between the bit line 319 and the storage node contact pad 328.

Furthermore, a bit line loading capacitance can be reduced because the second oxide spacers 320a having a low dielectric constant are formed on whole sidewalls of the bit lines 319.

According to embodiments of the invention, without directly forming bit line spacers on sidewalls of the bit lines after the bit lines are patterned, first spacers are formed on the sidewalls of the bit line mask patterns after partially etching a second insulating layer. Thus, a loss of the bit line mask pattern is remarkably reduced. As a result, a thickness of the bit line mask pattern can be minimized and an aspect ratio of the bit line can be greatly reduced because the second insulating layer is formed when no bit line spacers are formed. Also, a gap-fill margin between adjacent bit lines can be effectively increased.

In addition, an etching process for forming storage node contacts can be performed after forming the first spacers on the sidewalls of the bit line mask patterns. Hence, a shoulder margin of the bit line can be increased to prevent an electrical short-circuit caused between the bit line and the storage node contact pad.

Additionally, a parasitic capacitance between the bit line and the storage node contact pad or between adjacent bit lines, i.e., a bit line loading capacitance, can be decreased because the second spacers composed of oxide based material having a low dielectric constant are formed on the sidewalls of the bit lines.

Embodiments of the invention will now be described in a non-limiting way.

According to an embodiment of the invention, a semiconductor device includes a semiconductor substrate having capacitor contact regions and a first insulating layer formed on the substrate. Bit lines including first conductive patterns and bit line mask patterns formed on the first conductive patterns are formed on the first insulating layer between the capacitor contact regions. First spacers having an etching selectivity relative to an oxide based material are formed on upper portions of sidewalls of the bit lines from top ends of the bit line mask patterns to a predetermined portion of the bit line mask patterns. Second spacers including portions of the second insulating layer of an oxide based material are formed on the sidewalls of the bit lines beneath the first spacers. A second conductive layer for storage node contact pads are formed in the storage node contact holes that face with surfaces of the first and second spacers and pass through the first insulating layer to expose the capacitor contact regions.

According to another embodiment of the invention, the first spacers are formed using polysilicon so that the storage node contact pads have T-shaped structures including the second conductive layer and the first spacers.

In yet another embodiment of the invention, there is provided a method of manufacturing a semiconductor device as follows. First, a first insulating layer is formed on a semiconductor having capacitor contact regions. Bit lines having first conductive patterns and bit line mask patterns are formed on the first insulating layer between the capacitor contact regions. A second insulating layer composed of an oxide based material is formed on the bit lines and on the first insulating layer. Contact patterns having an etching selectivity relative to the second insulating layer are formed to open storage node contact hole regions. Using the contact patterns as masks, portions of the second insulating layer corresponding to the storage node contact hole regions are partially etched. First spacers composed of a material having an etching selectivity relative to the second insulating layer are formed on sidewalls of the etched portions. Using the first spacers as masks, the second and first insulating layers are etched to form storage node contact holes exposing the capacitor contact regions, and simultaneously form second spacers including portions of the second insulating layer on the sidewalls of the bit lines beneath the first spacers. A second conductive layer fills the storage node contact holes to form storage node contact pads.

According to still another embodiment of the invention, each of bit lines includes at least one buffer layer formed on the bit line mask pattern.

The contact patterns may have line shapes such that a plurality of storage node contact holes adjacent to one after another in a direction perpendicular to the bit lines are merged and exposed. Alternatively, the contact patterns may have contact shaped opening the storage node contact hole regions, respectively.

According to an additional embodiment of the invention, a first insulating layer is formed on a semiconductor having capacitor contact regions. Bit lines having first conductive patterns and bit line mask patterns are formed on the first insulating layer between the capacitor contact regions. A second insulating layer composed of an oxide based material is formed on the bit lines and on the first insulating layer. The second insulating layer is planarized when surfaces of the bit lines are exposed. Contact patterns having an etching selectivity relative to the second insulating layer are formed on the bit lines to open storage node contact hole regions. First spacers composed of a material having an etching selectivity relative to the second insulating layer are formed on sidewalls of the contact patterns. Using the contact patterns and the contact spacers as masks, the second insulating layer and the first insulating layer are etched to form storage node contact holes exposing the capacitor contact regions, and simultaneously form second spacers composed of portions of the second insulating layer on the sidewalls of the bit lines. A second conductive layer fills the storage node contact holes to form storage node contact pads.

According to embodiments of the invention, without directly forming bit line spacers on sidewalls of the bit lines after the bit lines are formed, first spacers are formed on sidewalls of the bit line mask patterns after partially etching the second insulating layer, thereby remarkably decreasing a loss of the bit line mask pattern. Hence, a thickness of the bit line mask pattern can be minimized and an aspect ratio of the bit line can be reduced because the second insulating layer is formed where no bit line spacer is formed. As a result, a gap fill margin between adjacent bit lines can be increased.

Further, the etching process for forming the storage node contacts is carried out after forming the first spacers on the sidewalls of the bit line mask patterns so that a shoulder margin of the bit line increases to prevent an electrical short-circuit caused between the bit line and the storage node contact pad.

In addition, a parasitic capacitance between the bit line and the storage node contact pad or between the bit line and an adjacent bit line, i.e., a bit line loading capacitance, can be decreased because the second spacers of an oxide based material having a low dielectric constant are formed on the sidewalls of the bit lines.

The invention has been described with reference to various exemplary embodiments thereof. The scope of the invention must not be interpreted, however, as being restricted to these exemplary embodiments. Rather, it will be apparent to those of ordinary skill in the art that various modifications may be made to the described embodiments without departing from the spirit and scope of the invention.

The invention claimed is:

1. A semiconductor device comprising:
   a semiconductor substrate;
   an insulating layer on the semiconductor substrate, the insulating layer having storage node contact holes defined therein;
   bit lines on the insulating layer between the storage node contact holes;
   insulating spacers on sidewalls of the bit lines, wherein an uppermost surface of the insulating spacers is below a top surface of the bit lines; and
   storage node contact pads in the storage node contact holes and on the uppermost surface of the insulating spacers and on sidewalls of the bit lines.

2. The semiconductor device of claim 1, wherein each bit line comprises:
   a conductive pattern; and
   a bit line mask pattern on the conductive pattern.

3. The semiconductor device of claim 2, wherein the conductive pattern comprises tungsten.

4. The semiconductor device of claim 2, wherein the bit line mask pattern comprises nitride.

5. The semiconductor device of claim 1, wherein the storage node contact pads comprise polysilicon.

6. The semiconductor device of claim 1, wherein the storage node contact pads comprise:
   a conductive spacer on the uppermost surface of an insulating spacer and on a sidewall of the bit lines; and
   a conductive layer on the conductive spacer and in a storage node contact hole.

7. The semiconductor device of claim 1, wherein the storage node contact pads are substantially co-planar with the top surface of the bit lines.

8. The semiconductor device of claim 2, further comprising insulating material on the top surface of the bit lines.

9. The semiconductor device of claim 8, wherein a width of the insulating material is at least as large as a width of the bit line.

10. The semiconductor device of claim 8, wherein the storage node contact pads are substantially co-planar with the top surface of the insulating material.

11. The semiconductor device of claim 8, wherein the insulating spacers and the insulating material are formed from the same layer.

12. A semiconductor device comprising:
    a semiconductor substrate;
    an insulating layer on the semiconductor substrate, the first insulating layer having a plurality of storage node contact holes defined therein;
    bit lines on the first insulating layer between the storage node contact holes;
    insulating spacers on sidewalls of the bit lines, wherein an uppermost surface of the insulating spacers is below a top surface of the bit lines;
    conductive spacers on sidewalls of the bit lines and on the uppermost surface of the insulating spacers; and
    a conductive layer in the storage node contact holes and on the conductive spacers.

13. The semiconductor device of claim 12, wherein each bit line comprises:
    a conductive pattern; and
    a bit line mask pattern on the conductive pattern.

14. The semiconductor device of claim 13, wherein the bit line mask pattern comprises nitride.

15. The semiconductor device of claim 13, further comprising insulating material on the top surfaces and on sidewalls of the bit lines.

16. The semiconductor device of claim 14, wherein the conductive layer is substantially co-planar with the top surface of the insulating material.

17. The semiconductor device of claim 15, wherein the insulating spacers and the insulating material are formed from the same layer.

18. The semiconductor device of claim 12, wherein the conductive spacers comprise polysilicon.

19. The semiconductor device of claim 12, wherein the conductive layer is substantially co-planar with the top surface of the bit lines.

* * * * *

UNITED STATES PATENT AND TRADEMARK OFFICE
CERTIFICATE OF CORRECTION

PATENT NO. : 7,307,305 B2  Page 1 of 1
APPLICATION NO. : 11/143197
DATED : December 11, 2007
INVENTOR(S) : Jae-Goo Lee et al.

It is certified that error appears in the above-identified patent and that said Letters Patent is hereby corrected as shown below:

Column 1, line 67, the word "from" should read -- form --;
Column 20, line 19, the words "claim 14," should read -- claim 15, --.

Signed and Sealed this

Second Day of September, 2008

JON W. DUDAS
*Director of the United States Patent and Trademark Office*